(12) United States Patent
Ecton et al.

(10) Patent No.: US 11,942,334 B2
(45) Date of Patent: Mar. 26, 2024

(54) MICROELECTRONIC ASSEMBLIES HAVING CONDUCTIVE STRUCTURES WITH DIFFERENT THICKNESSES

(71) Applicant: Intel Corporation, Santa Clara, CA (US)

(72) Inventors: Jeremy Ecton, Gilbert, AZ (US); Aleksandar Aleksov, Chandler, AZ (US); Suddhasattwa Nad, Chandler, AZ (US); Kristof Kuwawi Darmawikarta, Chandler, AZ (US); Vahidreza Parichehreh, Gilbert, AZ (US); Veronica Aleman Strong, Hillsboro, OR (US); Xiaoying Guo, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 1142 days.

(21) Appl. No.: 16/231,181

(22) Filed: Dec. 21, 2018

(65) Prior Publication Data

US 2020/0205279 A1 Jun. 25, 2020

(51) Int. Cl.
| | |
|---|---|
| *H05K 1/02* | (2006.01) |
| *H01L 21/027* | (2006.01) |
| *H01L 21/48* | (2006.01) |
| *H01L 23/00* | (2006.01) |
| *H01L 23/498* | (2006.01) |
| *H01L 23/538* | (2006.01) |

(52) U.S. Cl.
CPC ...... *H01L 21/4846* (2013.01); *H01L 21/0273* (2013.01); *H01L 21/0274* (2013.01); *H01L 21/0275* (2013.01); *H01L 21/486* (2013.01); *H01L 23/49816* (2013.01); *H01L 23/49827* (2013.01); *H01L 23/49838* (2013.01); *H01L 23/5384* (2013.01); *H01L 23/5386* (2013.01); *H01L 24/16* (2013.01); *H05K 1/0218* (2013.01); *H01L 2224/16225* (2013.01)

(58) Field of Classification Search
CPC ...... H05K 1/02; H05K 1/0218; H01L 21/486; H01L 21/4846; H01L 21/4857; H01L 23/49816; H01L 23/5384; H01L 23/145
USPC .......................... 361/767–794; 174/258–264
See application file for complete search history.

(56) References Cited

U.S. PATENT DOCUMENTS

| | | | |
|---|---|---|---|
| 6,477,060 B1 * | 11/2002 | Peter .................... | H05K 1/0237 257/702 |
| 7,476,813 B2 * | 1/2009 | Shi ........................ | H05K 1/112 174/262 |
| 9,761,465 B2 * | 9/2017 | Rotem .................... | H01L 24/85 |
| 10,068,776 B1 * | 9/2018 | Truong ............. | H01L 21/76819 |

(Continued)

FOREIGN PATENT DOCUMENTS

WO 2017171824 A1 10/2017

*Primary Examiner* — Tuan T Dinh
(74) *Attorney, Agent, or Firm* — Akona IP PC

(57) ABSTRACT

Microelectronic assemblies, and related devices and methods, are disclosed herein. For example, in some embodiments, a microelectronic assembly may include a substrate layer having a surface; a first conductive trace having a first thickness on the surface of the substrate layer; and a second conductive trace having a second thickness on the surface of the substrate layer, wherein the second thickness is different from the first thickness. In some embodiments, the first conductive trace and the second conductive trace have rectangular cross-sections.

20 Claims, 21 Drawing Sheets

(56) References Cited

U.S. PATENT DOCUMENTS

| | | | |
|---|---|---|---|
| 2008/0080155 A1* | 4/2008 | Ye | H05K 1/0253 |
| | | | 361/777 |
| 2012/0208129 A1* | 8/2012 | Kuo | H01L 24/11 |
| | | | 430/312 |
| 2012/0286418 A1* | 11/2012 | Lee | H01L 24/81 |
| | | | 257/737 |
| 2013/0200531 A1* | 8/2013 | Myung | H01L 23/49822 |
| | | | 174/250 |
| 2013/0235545 A1* | 9/2013 | Ohmi | H05K 1/0237 |
| | | | 361/783 |
| 2014/0000952 A1* | 1/2014 | Ko | H05K 1/114 |
| | | | 174/262 |
| 2014/0061897 A1* | 3/2014 | Lin | H01L 24/17 |
| | | | 257/737 |
| 2014/0071646 A1* | 3/2014 | Qian | H05K 3/4644 |
| | | | 174/250 |
| 2014/0090767 A1* | 4/2014 | Paul | B32B 27/285 |
| | | | 156/60 |
| 2014/0160707 A1 | 6/2014 | Zhang et al. | |
| 2016/0035722 A1* | 2/2016 | Or-Bach | H01L 24/94 |
| | | | 257/504 |
| 2016/0104632 A1 | 4/2016 | Zhang et al. | |
| 2016/0157347 A1* | 6/2016 | Roessler | H05K 1/115 |
| | | | 174/262 |
| 2016/0307862 A1* | 10/2016 | Lin | H01L 21/76885 |
| 2017/0053840 A1 | 2/2017 | Basker et al. | |
| 2017/0338174 A1* | 11/2017 | Hu | H01L 21/486 |
| 2019/0103348 A1* | 4/2019 | Manepalli | C25D 5/022 |
| 2019/0355654 A1 | 11/2019 | Xu et al. | |
| 2019/0378789 A1 | 12/2019 | Ecton | |

* cited by examiner

MICROELECTRONIC ASSEMBLIES HAVING CONDUCTIVE STRUCTURES WITH DIFFERENT THICKNESSES

BACKGROUND

Integrated circuit devices are conventionally coupled to a package substrate for mechanical stability and to facilitate connection to other components via conductive pathways in the package substrate, such as circuit boards. The conductive pathways may include signal traces for the routing of signals and power traces for the routing of power.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2I are side, cross-sectional views of various stages in an example process for manufacturing a microelectronic assembly, in accordance with various embodiments.

DETAILED DESCRIPTION

Figure 1A:
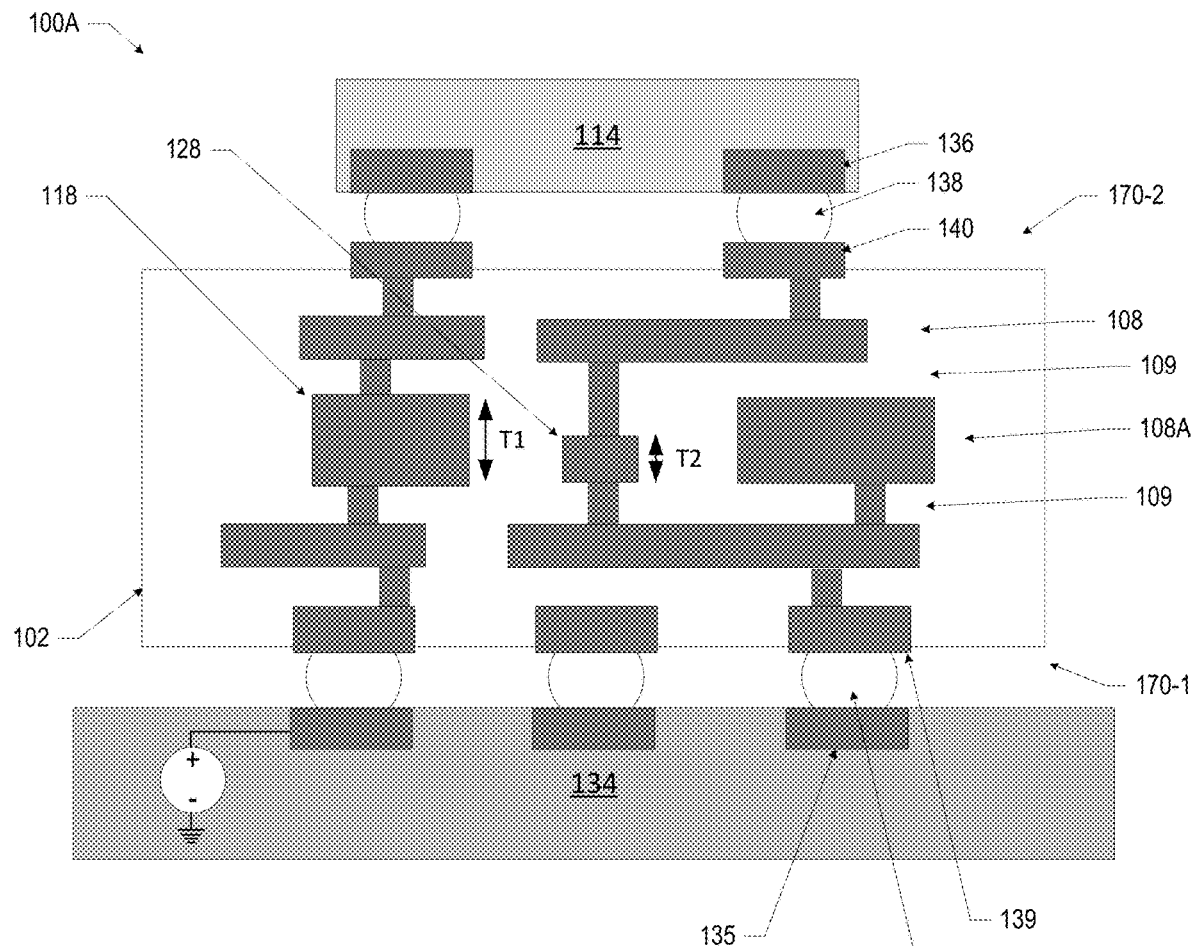
FIG. 1A is a side, cross-sectional view of an example microelectronic assembly, in accordance with various embodiments.

Microelectronic assemblies that include a substrate having two or more conductive structures with different thicknesses thereon and related devices and methods are disclosed herein. For example, in some embodiments, a microelectronic assembly may include a substrate having a surface; a first conductive feature having a first thickness on the surface of the substrate, wherein a cross-section of the first conductive feature is rectangular; and a second conductive feature having a second thickness on the surface of the substrate, wherein a cross-section of the second conductive feature is rectangular, and wherein the second thickness is different from the first thickness. In some embodiments, a method of manufacturing a microelectronic assembly may include depositing and patterning a dose-selective photoresist layer on a substrate; exposing the dose-selective photoresist layer to at least two radiation levels; performing a first development to form one or more first openings in the dose-selective photoresist layer; forming a first conductive layer in the one or more first openings to form one or more conductive features having a first thickness; performing a second development to form one or more second openings in the dose-selective photoresist layer; and forming a second conductive layer in the one or more second openings to form one or more conductive features having a second thickness and in the one or more first openings to form one or more conductive features having a third thickness, wherein the second thickness is different from the third thickness.

Communicating large numbers of signals in an integrated circuit (IC) package is challenging due to the increasingly small size of IC dies, thermal constraints, z-height constraints, form factor constraints, performance constraints, and power delivery constraints, among others. In some embodiments, it may be desirable for power traces to have a greater cross-sectional area (i.e., x-y direction) and/or a greater thickness (i.e., z-height) as compared to the routing traces. A greater cross-sectional area and/or a greater thickness may provide for reduced direct current resistance (RDC) and increased efficiency. The increased efficiency may have benefits, such as enabling a longer battery life or requiring less power. As used herein, a power trace may refer to a trace that is to route power between a component (e.g., a processor or memory) coupled with the power trace and a power supply. As used herein, a routing trace may refer to a trace that is to carry data signals to or from a component coupled with the routing trace. For example, the routing traces may carry data signals between various processors, or between a processor and a memory.

Forming traces having different thicknesses typically requires two lithography steps, which is likely to cause misalignment between lithography steps and may require larger traces to compensate for the misalignment and/or may require larger input/output (I/O) rules. Larger traces and constrained routing space may decrease IC device performance due to mismatched impedances for different traces. Further, forming traces having different thicknesses using two lithography steps usually results in non-rectilinear traces (e.g., traces having surfaces that are not straight or linear), or traces having a cross-section that is non-rectangular to offset the misalignment error between steps. For example, a trace may have a larger cross-section for a first conductive material deposition as compared to a second conductive material deposition, or a trace may have a curved surface resulting from a second conductive material deposition having a larger cross-section and/or rounded or domed top surface as compared with a first conductive material deposition, where the second conductive material deposition completely covers the first material deposition. Various ones of the microelectronic assemblies disclosed herein may exhibit better power delivery, increased efficiency, and increased battery life relative to conventional approaches. The microelectronic assemblies disclosed herein may be particularly advantageous for high-performance computing, and multiple chip IC packages.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 2" may be used to refer to the collection of drawings of FIGS. 2A-2I, the phrase "FIG. 4" may be used to refer to the collection of drawings of FIGS. 4A-4F, etc. Although certain elements may be referred to in the singular herein, such elements may include multiple sub-elements. For example, "an insulating material" may include one or more insulating materials.

As used herein, "conductive pathways" may include conductive traces, pads, vias, and through-holes, and other conductive structures that electrically couple an IC package component to another IC package component or to another component external to the IC package. As used herein, the terms "trace" and "line" may be used interchangeably and may refer to an interconnect in a conductive layer. As used herein, "conductive structures," "conductive features," and "conductive elements" may be used interchangeably and may refer to a trace, a line, a plane, a pad, or another conductive component. The terms "routing trace" and "signal trace" may be used interchangeably herein.

FIG. 1A is a side, cross-sectional view of a microelectronic assembly 100A, in accordance with various embodiments. The microelectronic assembly 100A may include a package substrate 102 having a plurality of conductive layers 108 and a plurality of dielectric layers 109. In particular, the package substrate 102 may include a conductive layer 108A having a first conductive feature 118 with a first thickness (T1) and a second conductive feature 128 with a second thickness (T2), where the first thickness (T1) is different from the second thickness (T2). For example, as shown in FIG. 1A, the first thickness is greater than the second thickness. In some embodiments, the first and second conductive features 118, 128 may have a rectangular cross-section, such that the first and second conductive features 118, 128 have a uniform width (e.g., y-dimension). In some embodiments, the first and second conductive features 118, 128 may be rectilinear, such that the first and second conductive features 118, 128 have a uniform width (e.g., y-dimension). As used herein, rectilinear refers to a feature having straight surfaces (e.g., a structure having linear top, bottom, and side surfaces), where the side surfaces are perpendicular to the top surface and the bottom surface (e.g., side surfaces meet the top and bottom surfaces at 90 degrees), such that the feature has a uniform width along a thickness (e.g., z-dimension). For example, rectilinear may refer to a feature shaped as a hexagonal prism, which has two hexagons for bases (e.g., top and bottom surfaces and six rectangular sides). As used herein, "a structure having a uniform width," "a structure having a rectangular cross-section," and "a rectilinear structure" generally refer to a structure having straight surfaces, where the side surfaces are perpendicular to a top surface and a bottom surface with some margin of error, for example, where the side surfaces may taper or slant with no more than a 3 micron (um) differential between a top width and a bottom width of the structure. In some embodiments, the first and second conductive features may be first and second traces, respectively. In some embodiments, a first trace may have a first thickness that is greater than a second thickness and may be arranged to carry power or ground, and a second trace may have a second thickness that is less than the first thickness and may be arranged to carry a signal. For example, the first trace may be coupled to a power plane, or a ground plane, and the second trace may be coupled to an electrical signal or a transmission line. In some embodiments, a first and/or second conductive feature may be a contact pad or a plane.

The package substrate may be any suitable substrate. The package substrate 102 may be a cored or coreless substrate of a semiconductor package. The package substrate 102 may be glass, an organic package substrate, an inorganic package substrate, or a combination of organic and inorganic materials.

The plurality of dielectric layers 109 of the package substrate 102 may be formed using any suitable process, including, for example, chemical vapor deposition (CVD), film lamination, slit coating and curing, atomic layer deposition (ALD), or spin on process, among others, and with any suitable material. Examples of dielectric materials may include, for example, epoxy-based materials/films, ceramic/silica filled epoxide films, polyimide films, filled polyimide films, other organic materials, and other inorganic dielectric materials known from semiconductor processing, as well as silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). An individual dielectric layer 109 may include a single layer or may include multiple layers.

The package substrate 102 may include one or more conductive pathways through the dielectric material (e.g., conductive layers 108, including conductive traces and/or conductive vias, as shown). The conductive pathways may be formed using any suitable conductive material or materials, such as copper, silver, nickel, gold, aluminum, or other metals or alloys, for example. The conductive pathways may be formed using any suitable technique, such as electroplating. The conductive pathways in the package substrate 102 may be bordered by liner materials, such as adhesion liners and/or barrier liners, as suitable. An individual conductive layer 108 may include a single layer or may include multiple layers; for example, a conductive layer 108 may include a seed layer and a patterned trace layer. In some embodiments, a conductive layer 108 may be a patterned trace layer. In some embodiments, a conductive layer 108 may be a continuous layer. A reference to conductive layers 108 also refers to conductive layer 108A. Although FIG. 1A illustrates a specific number and arrangement of conductive pathways in the package substrate 102, these are simply illustrative, and any suitable number and arrangement may be used.

Microelectronic assembly 100A may include a die 114. The die 114 may be coupled to the package substrate 102 by first-level interconnects (FLI) 138 at a top surface 170-2 of the package substrate 102. In particular, the package substrate 102 may include conductive contacts 140 at its top surface 170-2, the die 114 may include conductive contacts 136 at its bottom surface, and the FLI 138 may electrically and mechanically couple the conductive contacts 136 and the conductive contacts 140. The FLI 138 illustrated in FIG. 1A are solder balls or solder bumps (e.g., for a ball grid array arrangement), but any suitable FLIs 138 may be used (e.g., pins in a pin grid array arrangement or lands in a land grid array arrangement).

The die 114 may include a semiconductor layer with active devices patterned on it (e.g., transistors, diodes, etc.), an insulating material (e.g., a dielectric material formed in multiple layers, or semiconductor material, as known in the art), and multiple conductive pathways formed through the insulating material. In some embodiments, the insulating material of a die 114 may include a dielectric material, such as silicon dioxide, silicon nitride, BT resin, polyimide materials, glass reinforced epoxy matrix materials, or low-k and ultra low-k dielectric (e.g., carbon doped dielectrics, fluorine-doped dielectrics, porous dielectrics, and organic polymeric dielectrics). For example, the die 114 may include a dielectric build-up film, such as Ajinomoto build-up film (ABF). In some embodiments, the insulating material of die 114 may be a semiconductor material, such as silicon, germanium, or a III-V material. In some embodiments, the die 114 may include silicon. The conductive pathways in die 114 may include conductive traces and/or conductive vias, and may connect any of the conductive contacts in the die 114 in any suitable manner (e.g., connecting multiple conductive contacts on a same surface of the die 114).

In some embodiments, the area between the die 114 and the package substrate 102 may be filled with underfill (not shown), which may be a mold compound or any other suitable material to fill the gap between the die 114 and the package substrate 102. Underfill may be applied using any suitable technique, such as transfer mold, capillary underfill, or epoxy flux as part of the thermal conductive bonding (TCB) process. In some embodiments, the underfill may extend beyond the area defined by the die 114.

Although FIG. 1A depicts a single die 114, the microelectronic assembly 100A may have any suitable number of dies. In some embodiments, the die 114 may be an active or passive die that may include input/output circuitry, high bandwidth memory, or enhanced dynamic random access memory (EDRAM). For example, the die 114 may include a processor (e.g., including transistors, arithmetic logic units, and other components) that may include a central processing unit (CPU), a graphics processing unit (GPU), or both. The processor may also include application-specific integrated circuits (ASIC). In some embodiments, microelectronic assemblies disclosed herein may include a plurality of dies coupled to the package substrate 102 or coupled to another die in a package-on-package (PoP) configuration. In some embodiments, the microelectronic assembly 100A may serve as a system-in-package (SiP) in which multiple dies having different functionality are included. In such embodiments, the microelectronic assembly may be referred to as an SiP.

The microelectronic assembly 100A of FIG. 1A may also include a circuit board 134. The package substrate 102 may be coupled to the circuit board 134 by second-level interconnects (SLI) 137 at a bottom surface 170-1 of the package substrate 102. In particular, the package substrate 102 may include conductive contacts 139 at its bottom surface 170-1, and the circuit board 134 may include conductive contacts 135 at its top surface; the SLI 137 may electrically and mechanically couple the conductive contacts 135 and the conductive contacts 139. The SLI 137 illustrated in FIG. 1A are solder balls (e.g., for a ball grid array arrangement), but any suitable SLI 137 may be used (e.g., pins in a pin grid array arrangement or lands in a land grid array arrangement). The circuit board 134 may be a motherboard, for example, and may have other components attached to it (not shown). The circuit board 134 may include conductive pathways and other conductive contacts (not shown) for routing power, ground, and signals through the circuit board 134, as known in the art. In some embodiments, the SLI 137 may not couple the package substrate 102 to a circuit board 134, but may instead couple the package substrate 102 to another IC package, an interposer, or any other suitable component.

A number of elements are illustrated in FIG. 1A, but a number of these elements may not be present in microelectronic assemblies disclosed herein. For example, in various embodiments, the SLI 137, and/or the circuit board 134 may not be included. Further, FIG. 1A illustrates a number of elements that are omitted from subsequent drawings for ease of illustration, but may be included in any of the microelectronic assemblies disclosed herein. Examples of such elements include the die 114, the FLI 138, the SLI 137, and/or the circuit board 134. Many of the elements of the microelectronic assembly 100A of FIG. 1A are included in other ones of the accompanying figures; the discussion of these elements is not repeated when discussing these figures, and any of these elements may take any of the forms disclosed herein. A number of elements are not illustrated in FIG. 1A, but may be present in microelectronic subassemblies disclosed herein; for example, additional active components, such as additional dies, or additional passive components, such as surface-mount resistors, capacitors, and/or inductors, may be disposed on the top surface or the bottom surface of the package substrate 102, or embedded in the package substrate 102, and may be electrically connected by the conductive pathways in the package substrate 102.

Figure 1B:
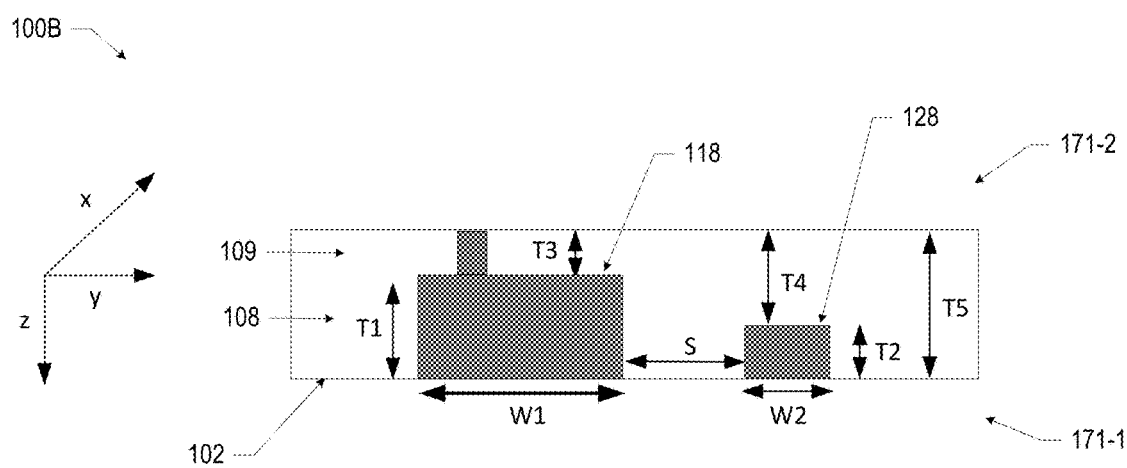
FIG. 1B is a side, cross-sectional, magnified view of a portion of the substrate of FIG. 1A, in accordance with various embodiments.

FIG. 1B is a cross-sectional, magnified view of a portion of a substrate of a microelectronic assembly 100B, in accordance with various embodiments. As shown in FIG. 1B, an x-dimension is length, a y-dimension is width, and a z-dimension is thickness. The microelectronic assembly 100B may include a package substrate 102 with a conductive layer 108 having a first conductive feature 118 with a first thickness (T1) and a second conductive feature 128 with a second thickness (T2), where T1 is different from T2. For example, as shown in FIG. 1A, T1 may be greater than T2. In some embodiments, T1 may be twice T2. In some embodiments, T1 may be greater than twice T2. In some embodiments, T1 may be less than twice T2. In some embodiments, T1 may be between 4 micron (um) and 70 um. In some embodiments, T1 may be between 4 um and 15 um. In some embodiments, T1 may be between 20 um and 40 um. In some embodiments, T1 may be between 50 um and 70 um. In some embodiments, T2 may be between 1 um and 60 um. In some embodiments, T2 may be between 1 um and 6 um. In some embodiments, T2 may be between 1 um and 35 um. In some embodiments, T2 may be between 10 um and 20 um. In some embodiments, T2 may be between 25 um and 35 um. In some embodiments, T2 may be between 35 um and 60 um.

The package substrate 102 may also include a dielectric layer 109 on the conductive layer 108, where the dielectric layer may have different thicknesses relative to the different conductive feature thicknesses. For example, the dielectric layer 109 may have a third thickness (T3) over the first conductive feature 118, a fourth thickness (T4) over the second conductive feature 128, and a fifth thickness (T5) when measured from a bottom surface 171-1 of the dielectric layer 109 to a top surface 171-2 of the dielectric layer 109. In some embodiments, T4 may be greater than T3. In some embodiments, T3 may be between 2 um and 50 um. In some embodiments, T4 may be between 3 um and 80 um. In some embodiments, T5 may be between 5 um and 90 um. In some embodiments, T5 may be between 5 um and 20 um. In some embodiments, T5 may be between 25 um and 50 um. In some embodiments, T5 may be between 60 um and 90 um.

As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, a higher density medium (e.g., the die 114) may have a line or space pitch of approximately 10 microns, while a lower density medium (e.g., the package substrate 102) may have a line or space pitch of approximately 40-50 microns. In another example, a higher density medium may have a line or space pitch of less than 20 microns, while a lower density medium may have a line or space pitch greater than 40 microns. A higher density medium may be manufactured using a modified semi-additive process or a semi-additive build-up process with advanced lithography (with small vertical interconnect features formed by advanced laser or lithography processes), while a lower density medium may be a printed circuit board (PCB) (e.g., circuit board 134) manufactured using a standard PCB process (e.g., a standard subtractive process using etch chemistry to remove areas of unwanted copper, and with coarse vertical interconnect features formed by a standard laser process).

As shown in FIG. 1B, the first conductive feature 118 may have a width (W1), the second conductive feature 128 may have a width (W2), and a space (S) between the first conductive feature 118 and the second conductive feature 128. The first and second conductive features 118, 128 may have a cross-section that is rectangular or may have a shape that is rectilinear, such that the first and second conductive features 118, 128 generally have a uniform width along a thickness (e.g., a same W1 or a same W2 along the z-height). As shown in FIG. 1B, the first and second conductive features 118, 128 may have any suitable lengths and may have different lengths. For example, as shown in FIG. 1B, the first conductive feature 118 may have a length W1, and the second conductive feature 128 may have a length W2, where W1 is greater than W2. In some embodiments, W1 may be between 5 um and 50 millimeters (mm). In some embodiments, W1 may be between 14 um and 50 mm. In some embodiments, for example, when the first conductive feature 118 is a power plane or a ground plane, W1 may be between 25 mm and 50 mm. In some embodiments, for example, when the first conductive feature 118 is a trace in an ultra-fine line package, W1 may be between 5 um and 50 um. In some embodiments, W2 may be between 1 um and 75 um. In some embodiments, W2 may be between 1 um and 6 um. In some embodiments, W2 may be between 7 um and 50 um. In some embodiments, W2 may be between 10 um and 75 um. In some embodiments, W2 and S may have the same dimensions. In some embodiments, W2 and S may have different dimensions. In some embodiments, S may be between 1 um and 100 um. In some embodiments, S may be between 1 um and 7 um. In some embodiments, S may be between 7 um and 50 um. In some embodiments, S may be between 10 um and 100 um.

Although FIG. 1B shows only two conductive features, a microelectronic assembly may include any number of conductive features in the conductive layer 108, including more than two conductive features, and the more than two conductive features may have any suitable thickness including a thickness equal to T1 or T2, or a thickness that is different from T1 or T2. Likewise, a microelectronic assembly may include a dielectric layer 109 with any number of thicknesses depending on the relative thicknesses of the two or more conductive features.

Any suitable techniques may be used to manufacture the microelectronic assemblies disclosed herein. For example, FIGS. 2A-2I are side, cross-sectional views of various stages in an example process for manufacturing a microelectronic assembly, in accordance with various embodiments. Although the operations discussed below with FIGS. 2A-2I (and others of the accompanying drawings representing manufacturing processes) are illustrated in a particular order, these operations may be performed in any suitable order. Additionally, although particular assemblies are illustrated in FIGS. 2A-2I (and others of the accompanying drawings representing manufacturing processes), the operations discussed below with reference to FIGS. 2A-2I may be used to form any suitable assemblies.

Figure 2A:
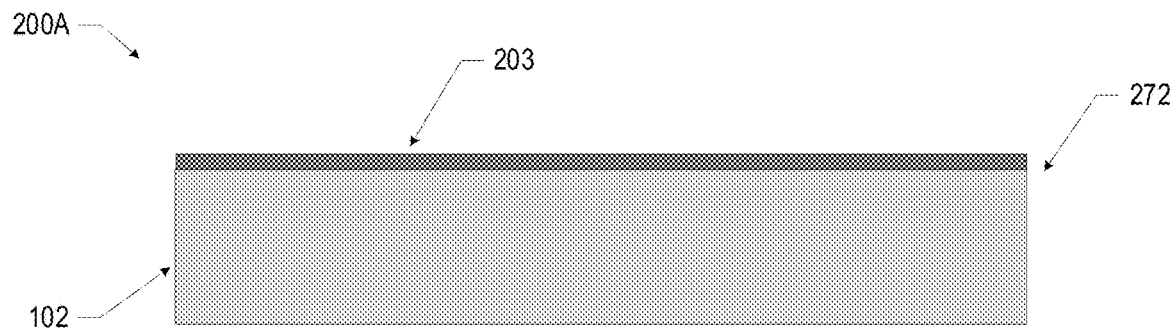

FIG. 2A illustrates an assembly 200A including a portion of a package substrate 102 subsequent to depositing a seed layer 203 on a top surface 272 of the portion of the package substrate 102. The seed layer 203 may be any suitable conductive material, including copper. The seed layer 203 may be formed by depositing conductive material using any suitable technique, including, for example, electroplating, sputtering, or electroless plating. In some embodiments, the seed layer 203 may be omitted.

Figure 2B:
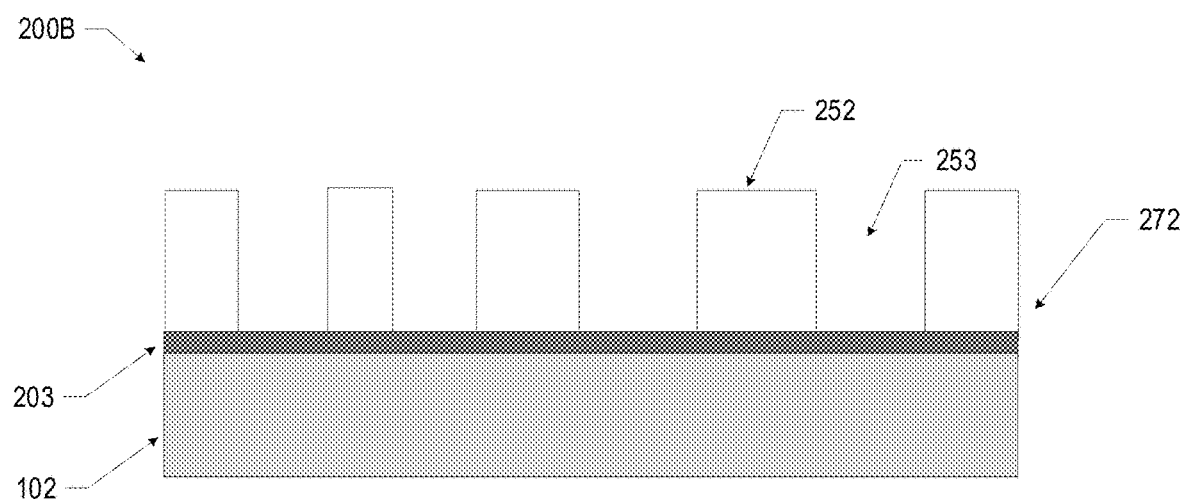

FIG. 2B illustrates an assembly 200B subsequent to depositing a first photoresist material 252 on the top surface 272 of the portion of the package substrate 102, and patterning the first photoresist material to provide openings 253 for the formation of conductive features (e.g., conductive traces or conductive pads). The first photoresist material 252 may be any suitable material, such as dry film resist (DFR), and may be patterned using any suitable technique, including a lithographic process (e.g., exposing the first photoresist material to a radiation source through a mask and developing with a developer). For example, the first photoresist material 252 may be deposited using lamination and may be positively or negatively charged to create crosslinked and non-crosslinked portions using ultraviolet for patterning conductive material layer. The non-crosslinked portions dissolve to form openings 253 where conductive material may be deposited. In some embodiments, a photo-imageable dielectric (PID) may be deposited by lamination and patterned by exposure to light. The openings 253 may have any suitable size and shape for forming a conductive feature having desired characteristics. For example, openings 253 may be shaped to form a conductive trace having a particular size and shape, such as a rectangular cross-section.

Figure 2C:
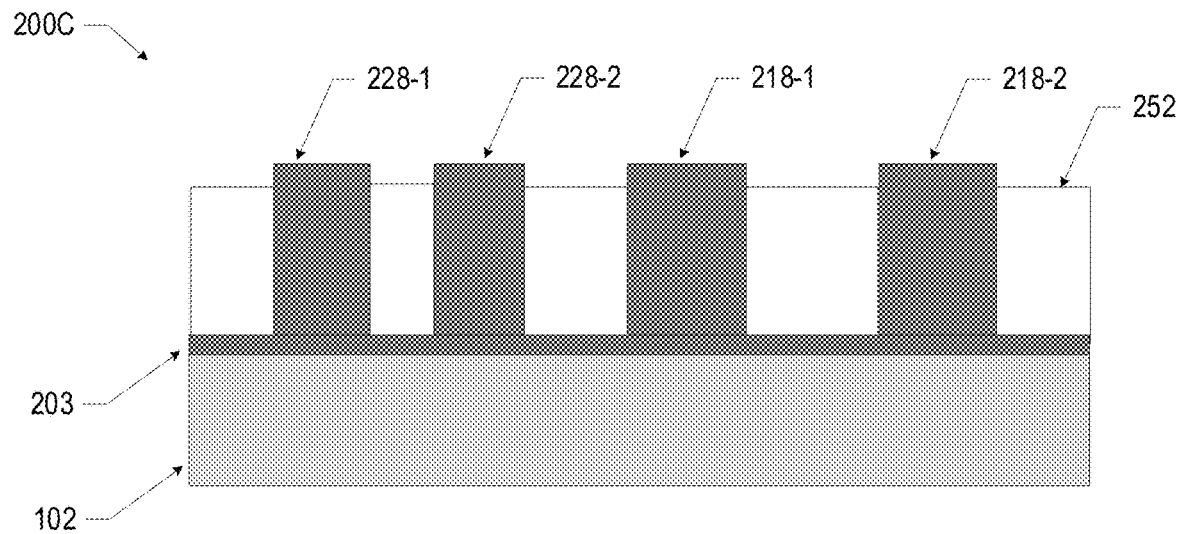

FIG. 2C illustrates an assembly 200C subsequent to depositing a conductive material in the openings 253 for the formation of conductive features, including conductive features 218-1, 218-2, 228-1, 228-2. The conductive features 218, 228 may be formed by depositing conductive material in the opening 253 using any suitable technique, including, for example, electroplating, sputtering, or electroless plating. The conductive features 218, 228 may be formed from any suitable conductive material, for example, copper (Cu), aluminum (Al), gold (Au), silver (Ag), and/or alloys thereof. The conductive material may have any suitable thickness (e.g., in some embodiments, a thickness between 1 um and 45 um). The conductive features may include conductive pads and/or traces; for example, the conductive feature 218 may include a trace electrically coupled to a power plane or a ground plane (not shown).

Figure 2D:
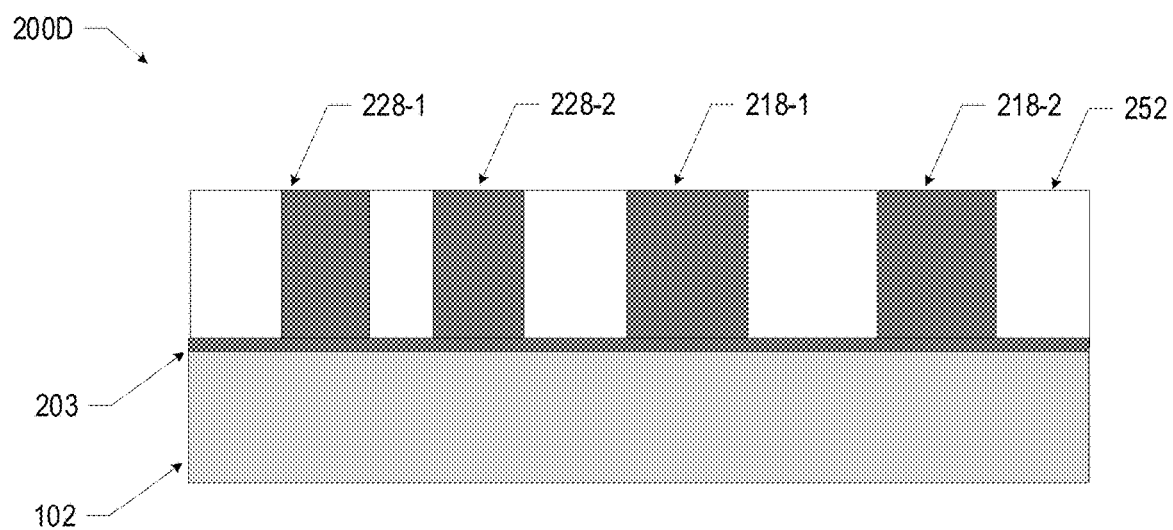

FIG. 2D illustrates an assembly 200D subsequent to planarizing or polishing the exposed top surface of the conductive features 218, 228 to a desired thickness T1. As shown in FIG. 2D, thickness T1 includes the thickness of the seed layer and the thickness of the conductive features. In some embodiments, the top surfaces of the conductive features may be recessed with a flash etching process, a wet etch or a dry etch process.

Figure 2E:
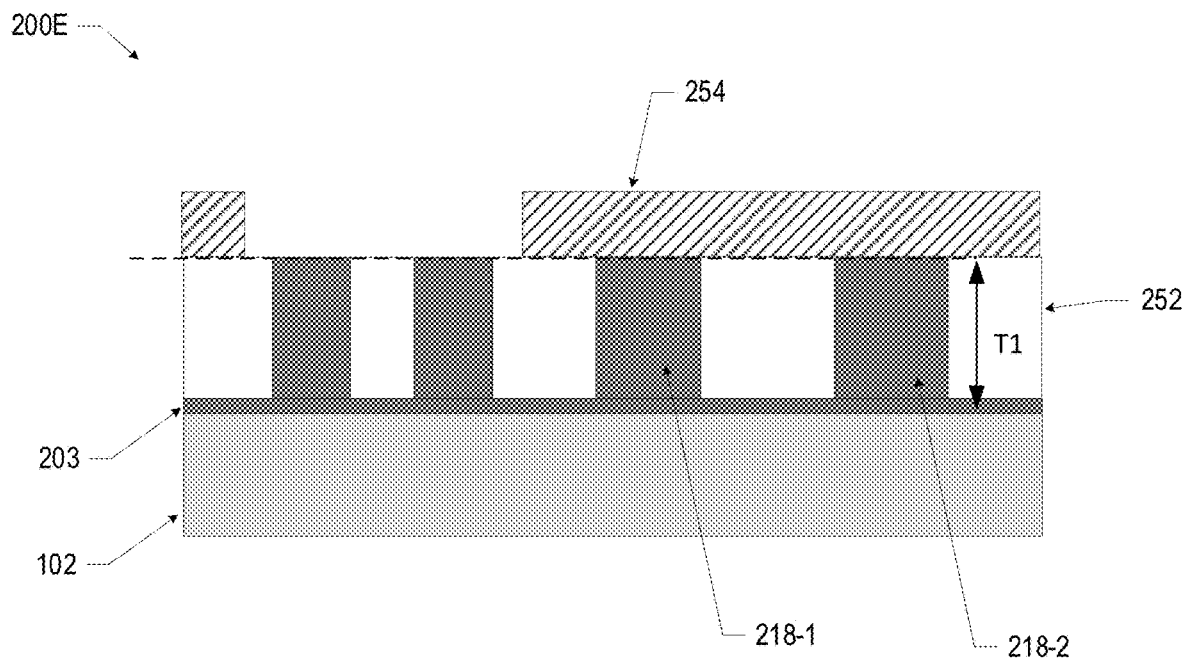

FIG. 2E illustrates an assembly 200E subsequent to depositing a second photoresist material 254 on the first photoresist material 252 and patterning the second photoresist material 254 to mask or cover a particular region, such as the conductive features 218-1, 218-2. The second photoresist material 254 may act as a barrier to prevent etching of the conductive material from the conductive features 218. As described above with reference to FIG. 2C, the second photoresist material 254 may be any suitable material, such as DFR, and may be patterned using any suitable technique, including a lithographic process.

Figure 2F:
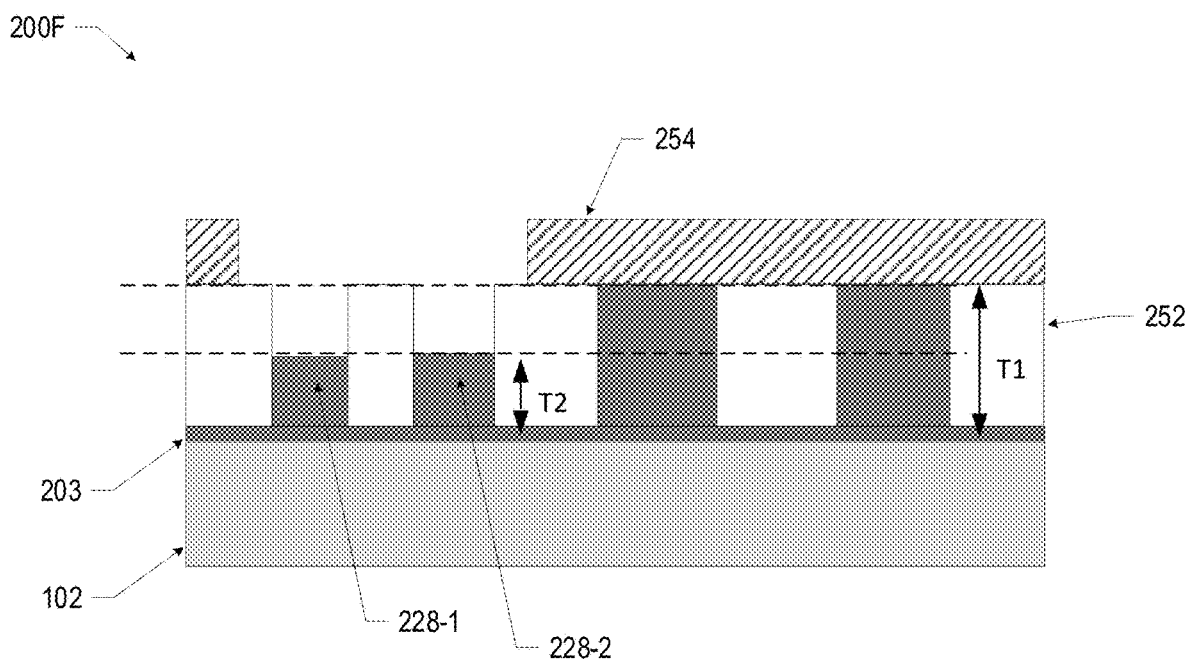

FIG. 2F illustrates an assembly 200F subsequent to etching the exposed conductive features 228-1, 228-2 to the desired thickness T2, where the thickness T2 is less than the thickness T1. As shown in FIG. 2F, thickness T2 includes the thickness of the seed layer and the thickness of the conductive features 228. In some embodiments, the conductive features 228-1, 228-2 may be recessed using a standard copper etch chemistry process, a wet etch process, or a dry etch process.

Figure 2G:
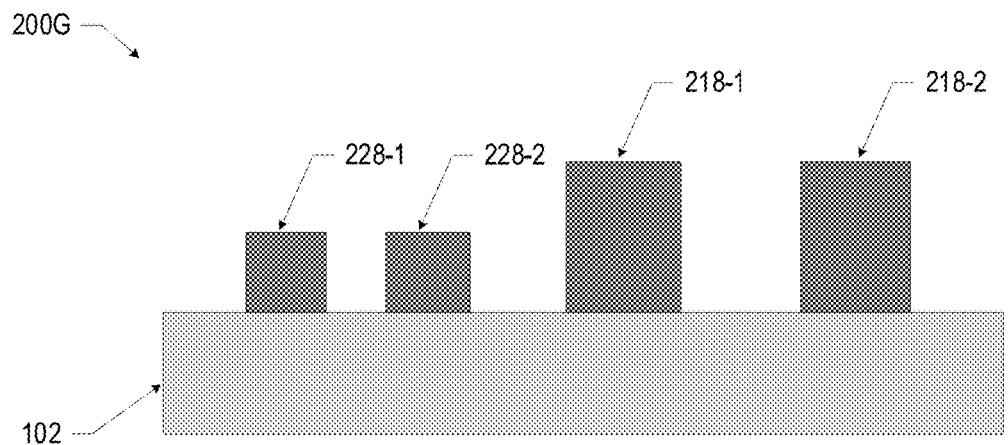

FIG. 2G illustrates an assembly 200G subsequent to stripping the first and second photoresist materials 252, 254 to expose the conductive features 218, 228, and removing the exposed portions of the seed layer. Although FIG. 2G shows particular conductive features 218, 228, the conductive features may take any form, including a conductive plane, or a conductive via. The exposed portions of the seed layer may be removed using any suitable process, including chemical etching, among others.

Figure 2H:
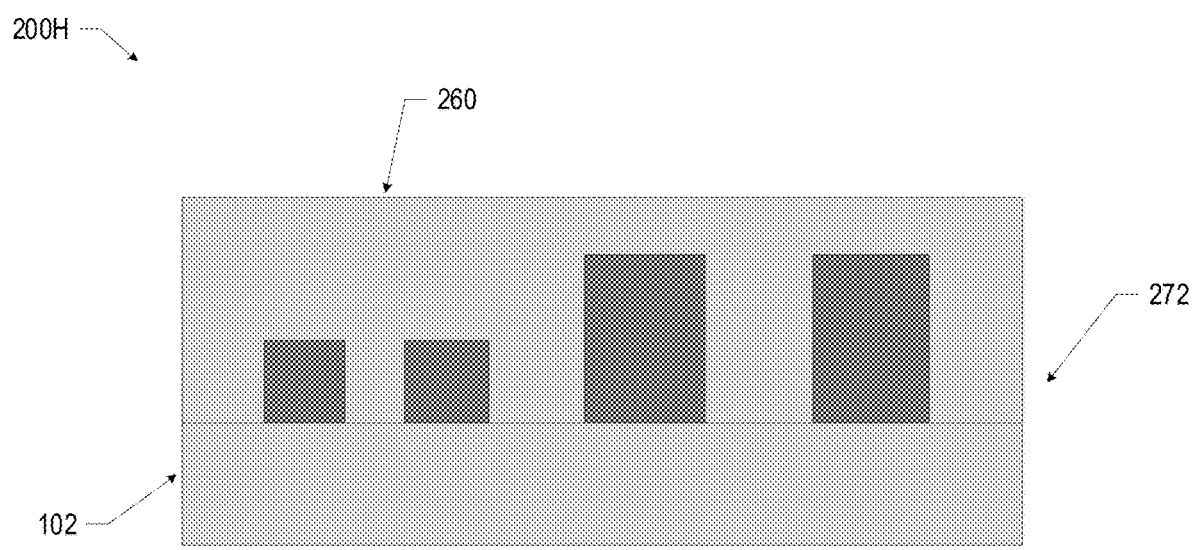
Figure 21:
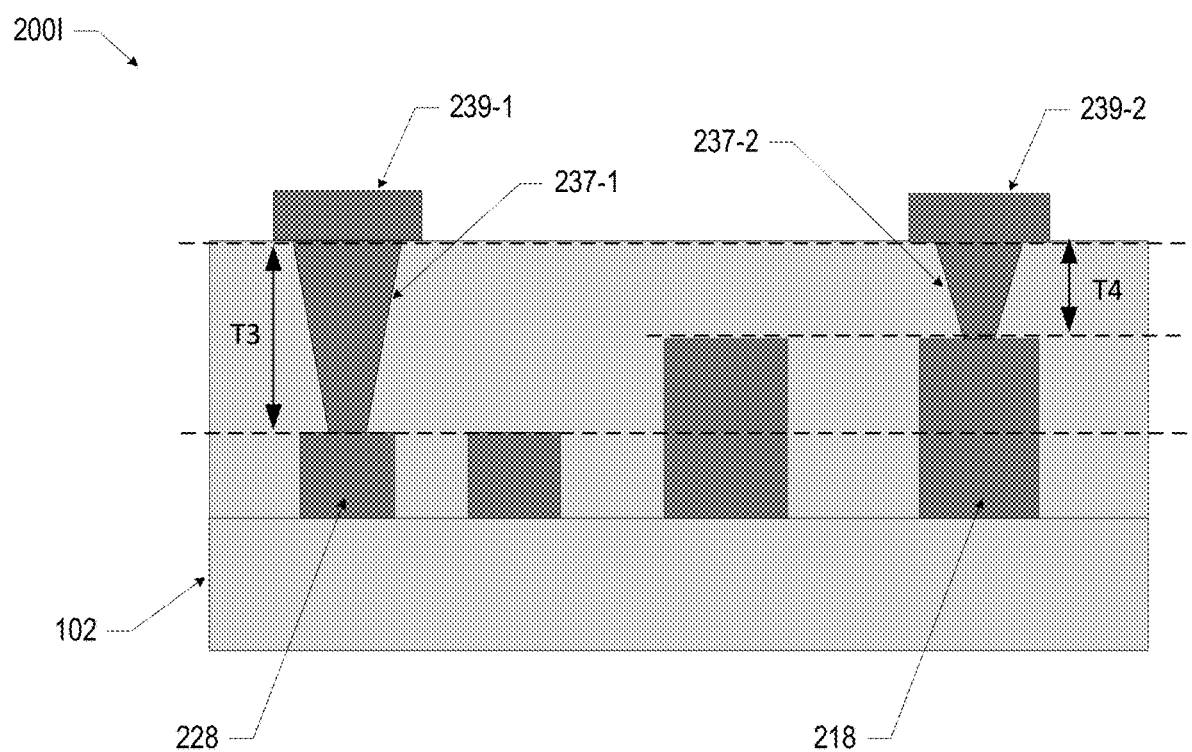

FIG. 2H illustrates an assembly 200H subsequent to forming a dielectric layer 260 over a top surface 272 of the portion of the package substrate 102, including the conductive features 218, 228 (e.g., over the top surface of assembly 200G). The dielectric layer 260 may be formed using any suitable process, including lamination, or slit coating and curing. The dielectric layer 260 may be formed to completely cover the conductive features 218, 228, such that the thickness of the deposited dielectric layer 260 is greater than the thickness of the conductive features 218, 228. In some embodiments, the dielectric layer 260 may be planarized using any suitable technique, including grinding. In some embodiments, the dielectric layer 260 may be flattened by a press, such as a stainless steel press. In some embodiments, the dielectric layer 260 may be removed to expose the top surface of the conductive features 218, 228 using any suitable technique, including grinding, or etching, such as a wet etch, a dry etch (e.g., a plasma etch), a wet blast, or a laser ablation (e.g., using excimer laser). In some embodiments, the thickness of the dielectric layer 260 may be minimized to reduce the etching time required to expose the top surface of the conductive features 218, 228.

Additional layers may be built up in the package substrate by repeating the process as described with respect to FIGS. 2A-2I, or by any suitable process, which is known in the art, including a semi-additive process (SAP). For example, FIG. 2I illustrates an assembly 200I subsequent to forming via openings and depositing conductive material in the via openings to form vias 237-1, 237-2 and contact pads 239-1, 239-2 on assembly 200H. The via openings may be formed using any suitable technique, including, for example, laser drilling. Any residue remaining in the opening may be cleaned away using any suitable process, such as a wet desmear process. The conductive material may be deposited in the opening using any suitable technique, including, for example, electroplating, sputtering, or electroless plating. The conductive material may be any suitable conductive material, including, copper, and may be a same conductive material as the conductive features 218, 228, or may be a different conductive material from the conductive features 218, 228. As shown in FIG. 2I, the conductive vias 237-1, 237-2 may have different thicknesses, where the conductive via 237-1 has a thickness T3 and conductive via 237-2 has a thickness T4, and where thickness T3 is greater than thickness T4. The different thicknesses may depend on the relative thickness of the associated conductive features 218, 228. The finished substrate may be a single package substrate or may be a repeating unit that may undergo a singulation process in which each unit is separated for one another to create a single package substrate. Further operations may be performed as suitable (e.g., attaching dies to the package substrate, attaching solder balls for coupling to a circuit board, etc.).

Although FIG. 2 shows a particular number and arrangement of conductive features, these are simply exemplary and a package substrate may have any suitable number and arrangement of conductive features. Further, although FIG. 2 shows conductive features having only two different thicknesses (i.e., thicknesses T1 and T2), the conductive features may have any suitable number of different thicknesses. For example, a conductive feature may have a fifth thickness T5 (not shown), where the fifth thickness T5 is different from the first thickness T1 and the second thickness T2. A different thickness may be formed by depositing additional photoresist layers and performing additional etching of the conductive features. For example, a third photoresist layer (not shown) may be deposited and patterned to cover the conductive feature 218-2 after a first etching to the second thickness T2, and a second etching may be performed on the conductive feature 218-1 to a fifth thickness T5, where the fifth thickness T5 is less than the first thickness T1 and less than the second thickness T2.

Figure 3:
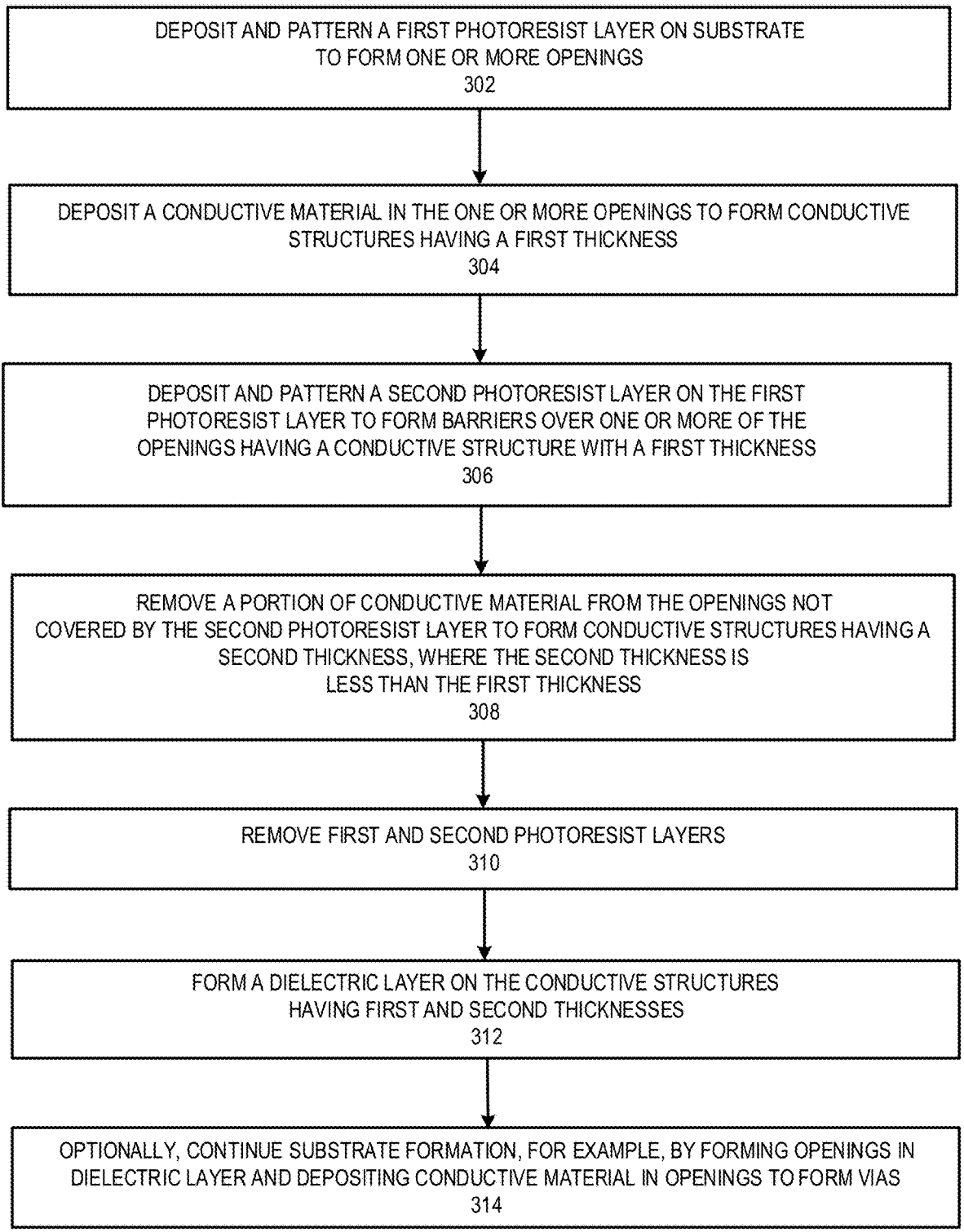
FIG. 3 is a process flow diagram of an example method of forming a microelectronic assembly, in accordance with various embodiments.

FIG. 3 is a process flow diagram of an example method of forming a microelectronic assembly including a substrate with a plurality of conductive structures having different thicknesses, in accordance with various embodiments. At 302, deposit and pattern a first photoresist layer on a substrate to create one or more openings for forming conductive structures. At 304, deposit a conductive material, such as copper, in the one or more openings to form one or more conductive structures having a first thickness. In some embodiments, a seed layer may be deposited before depositing the photoresist material and the conductive material. At 306, deposit and pattern a second photoresist layer on the first photoresist layer to form a covering or a barrier over one or more of the openings having a conductive structure with a first thickness. At 308, remove a portion of conductive material from the openings not covered by the second photoresist layer to form one or more conductive structures having a second thickness, where the second thickness is less than the first thickness. In some embodiments, the conductive material may be removed by chemical etching. A photoresist layer may be deposited, and patterned, by exposure to, for example, ultraviolet light, to form openings in the non-masked regions that correspond to the conductive structures. Conductive structures are formed by depositing conductive material, such as metal, in the openings by, for example, electrolytic plating. Conductive structures having a thickness less than the first and second thicknesses may be formed by repeating the process as described in 306 through 308 to form any number of photoresist layers and conductive structures having smaller thicknesses. At 310, remove the first and second photoresist layers to expose the one or more conductive structures having the first thickness and the one or more conductive structures having the second thickness. Optionally, form conductive vias coupled to the conductive structures having first and second thicknesses using a laser-drill-based process as described at 312-314. For example, at 312, form a dielectric layer on the conductive structures having different thicknesses (e.g., first and second thicknesses). At 314, laser drill one or more openings in the dielectric layer and deposit conductive material in the one or more openings to form conductive vias for coupling to the conductive structures having different thicknesses. Continue building up the substrate by adding additional conductive and dielectric layers couple the conductive structures having different thicknesses to other conductive interconnects, such as traces, pads, etc.

Figure 4A:
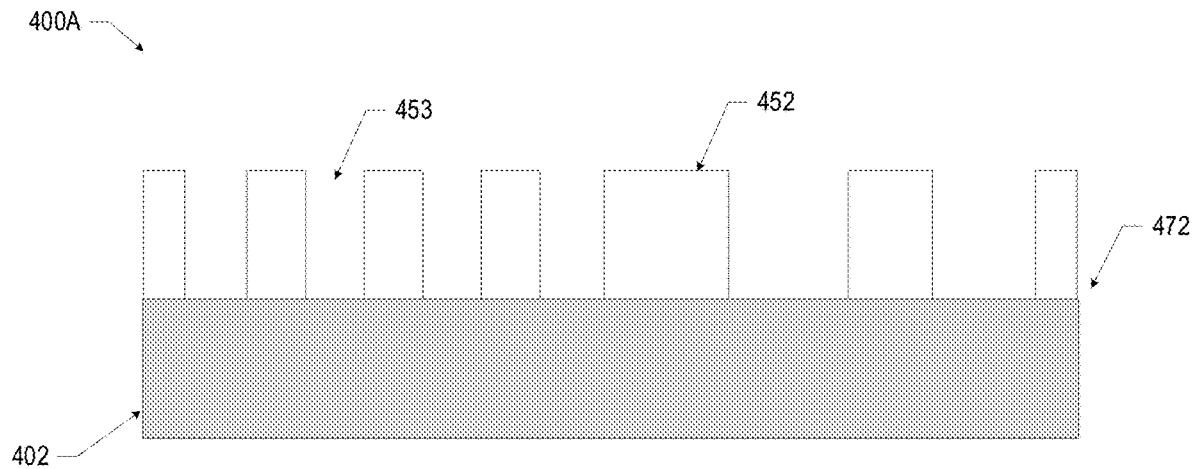
FIGS. 4A-4F are side, cross-sectional views of various stages in an example process for manufacturing a microelectronic assembly, in accordance with various embodiments.

FIG. 4A illustrates an assembly 400A including a substrate 402 subsequent to a first photoresist material 452 on a surface 472 of the substrate 402, and patterning the first photoresist material to provide openings 453 for the formation of conductive features (e.g., conductive traces). As described above with reference to FIG. 2, the first photoresist material 452 may be any suitable material and may be patterned using any suitable technique. The openings 453 may have any suitable size and shape for forming a conductive feature having desired characteristics. For example, openings 453 may be shaped to form a conductive trace having a particular size and shape, for example, a trace having a rectangular cross-section. In some embodiments, a seed layer (not shown) may be deposited on the surface 472 of the substrate 402 prior to depositing the first photoresist material. The seed layer may be any suitable conductive material, including copper. In some embodiments, the top surface of the substrate 402 is a dielectric layer in a package substrate.

Figure 4B:
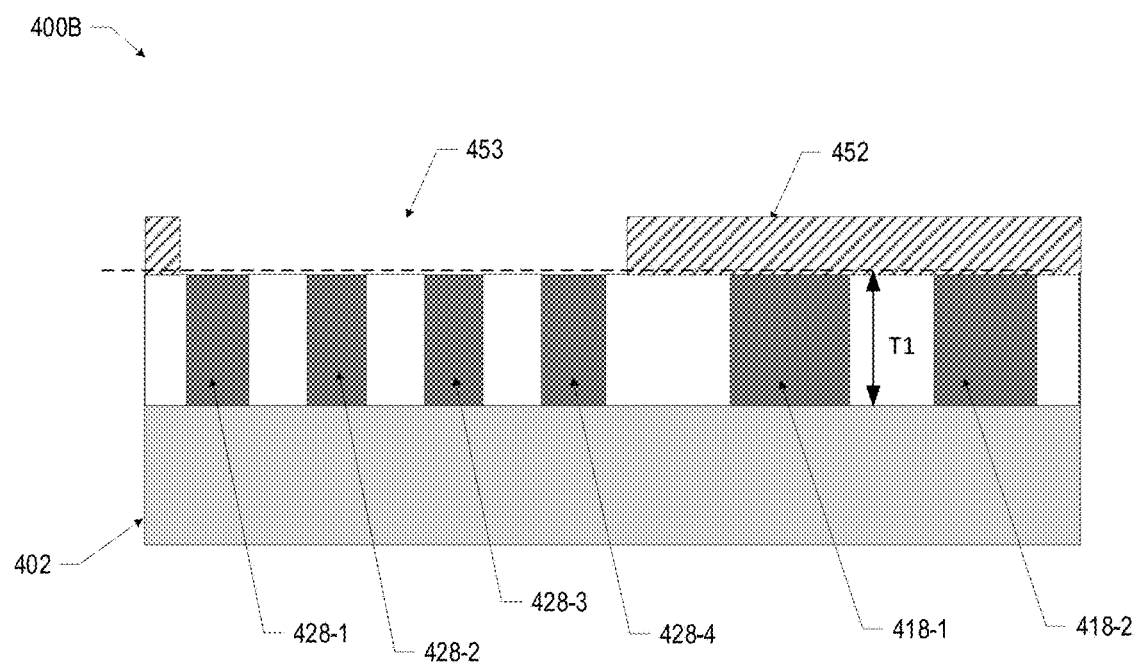

FIG. 4B illustrates an assembly 400B subsequent to depositing a conductive material in the openings 453 for the formation of conductive features, including conductive features 418-1, 418-2, 428-1-428-4, having a first thickness T1. The conductive features 418, 428 may be formed from any suitable conductive material using any suitable technique as described above with reference to FIG. 2. In some embodiments, the top surfaces of the conductive features 418, 428 may be planarized or polished as described above with reference to FIG. 2. Although multiple figures include a thickness T1, T2, T3, and T4, these thicknesses do not refer to a particular value. Instead, T1, T2, T3, and T4 may have any suitable value, or range of values, and the values may vary in the different figures.

Figure 4C:
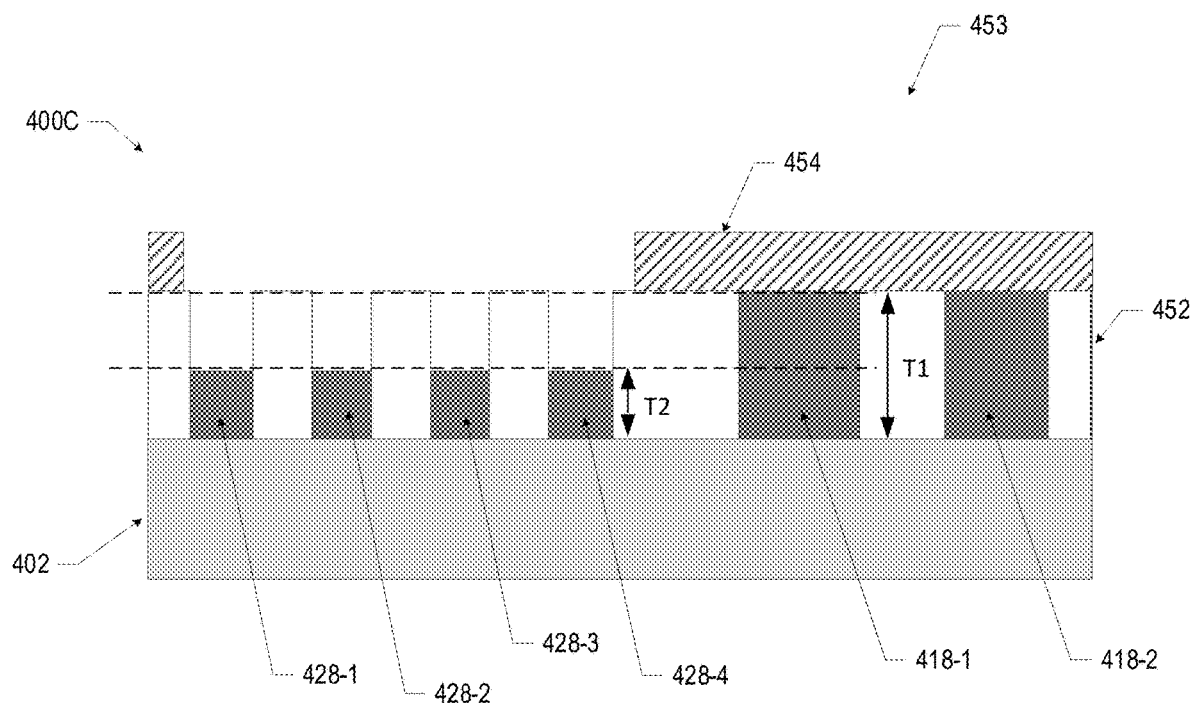

FIG. 4C illustrates an assembly 400C subsequent to depositing a second photoresist material 454 on the first photoresist material 452, patterning the second photoresist material 454 to mask or cover a particular region, such as the conductive features 418-1, 418-2, and etching the exposed conductive features 428-1-428-4 to a desired second thickness T2, where the second thickness T2 is less than the first thickness T1. The second photoresist material 454 may act as a barrier to prevent etching of the conductive material from the conductive features 418. As described above with reference to FIG. 2, the second photoresist material 454 may be any suitable material and may be patterned using any suitable technique, and the conductive features 428 may be etched using any suitable technique.

Figure 4D:
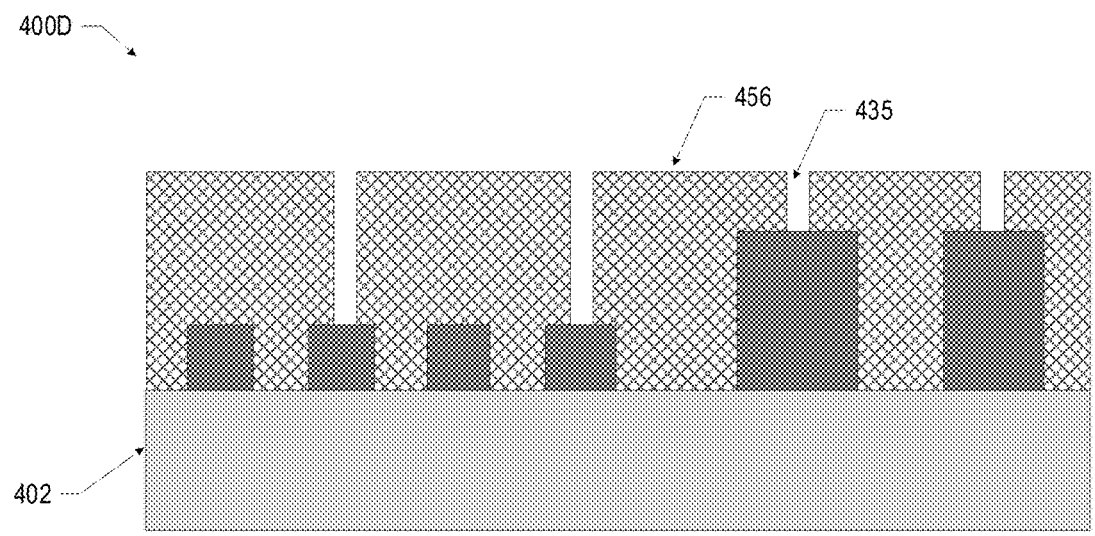

FIG. 4D illustrates an assembly 400D subsequent to stripping the first and second photoresist materials 452, 454, and depositing and patterning a third photoresist material 456 over the conductive features 418, 428 to provide openings 435 for forming vertical pillars or vias. For example, the conductive pillars may be formed using the third photoresist layer as part of a lithography-defined process.

Figure 4E:
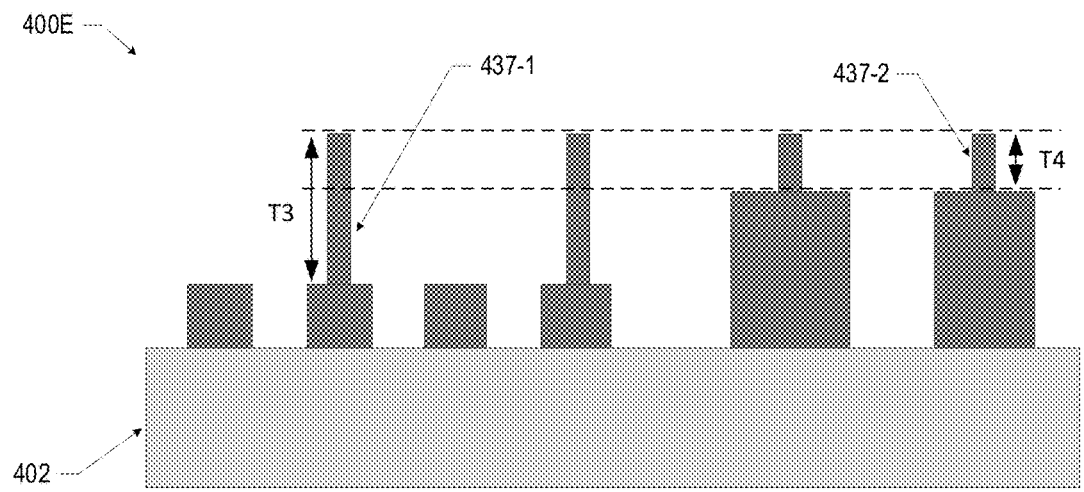

FIG. 4E illustrates an assembly 400E subsequent to depositing conductive material into the openings 435 to form conductive vias 437-1, 437-2, and removing the third photoresist material 456. The conductive material may be deposited using any suitable technique and may be any suitable material as described above with reference to FIG. 2. The conductive vias 437-1, 437-2 may have any suitable thickness and the thickness of conductive feature 437-1 may be different from the thickness of conductive feature 437-2. For example, the conductive via 437-1 may have a third thickness T3 and the conductive via 437-2 may have a fourth thickness T4, where the third thickness T3 is greater than the fourth thickness T4.

Figure 4F:
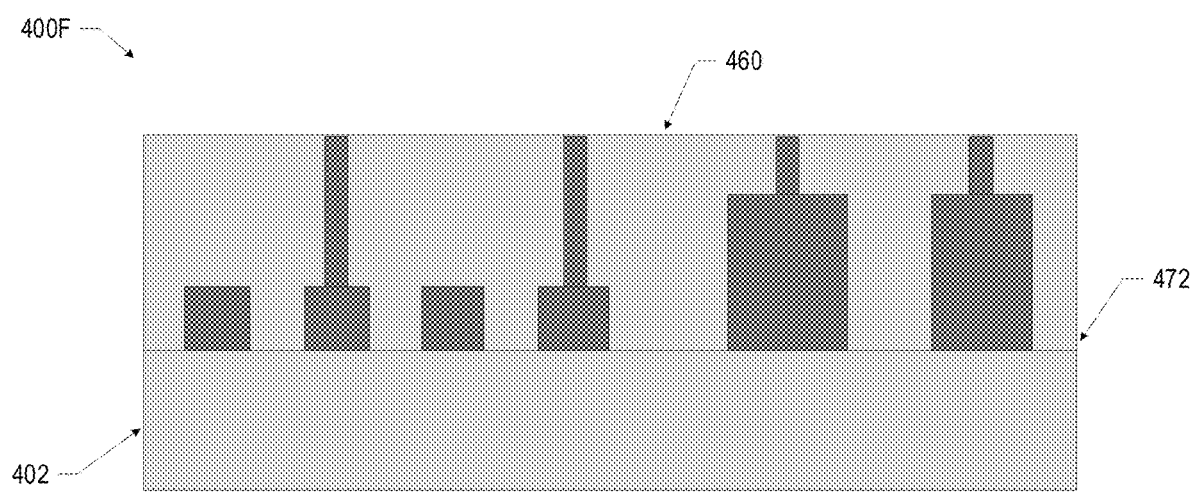

FIG. 4F illustrates an assembly 400F subsequent to forming a dielectric layer 460 over a top surface 472 of the substrate 402, including the conductive features 418, 428 and conductive vias 437 (e.g., over the top surface of assembly 400E). The dielectric layer 460 may be formed using any suitable process, as described above with reference to FIG. 2. Additional layers may be built up on the substrate 402 by repeating the process as described with respect to FIGS. 4A-4F, or by any suitable process, which is known in the art, including a lithographic process. The finished substrate may be a single package substrate or may be a repeating unit that may undergo a singulation process in which each unit is separated for one another to create a single package substrate. Further operations may be performed as suitable (e.g., attaching dies to the package substrate, attaching solder balls for coupling to a circuit board, etc.).

Figure 5:
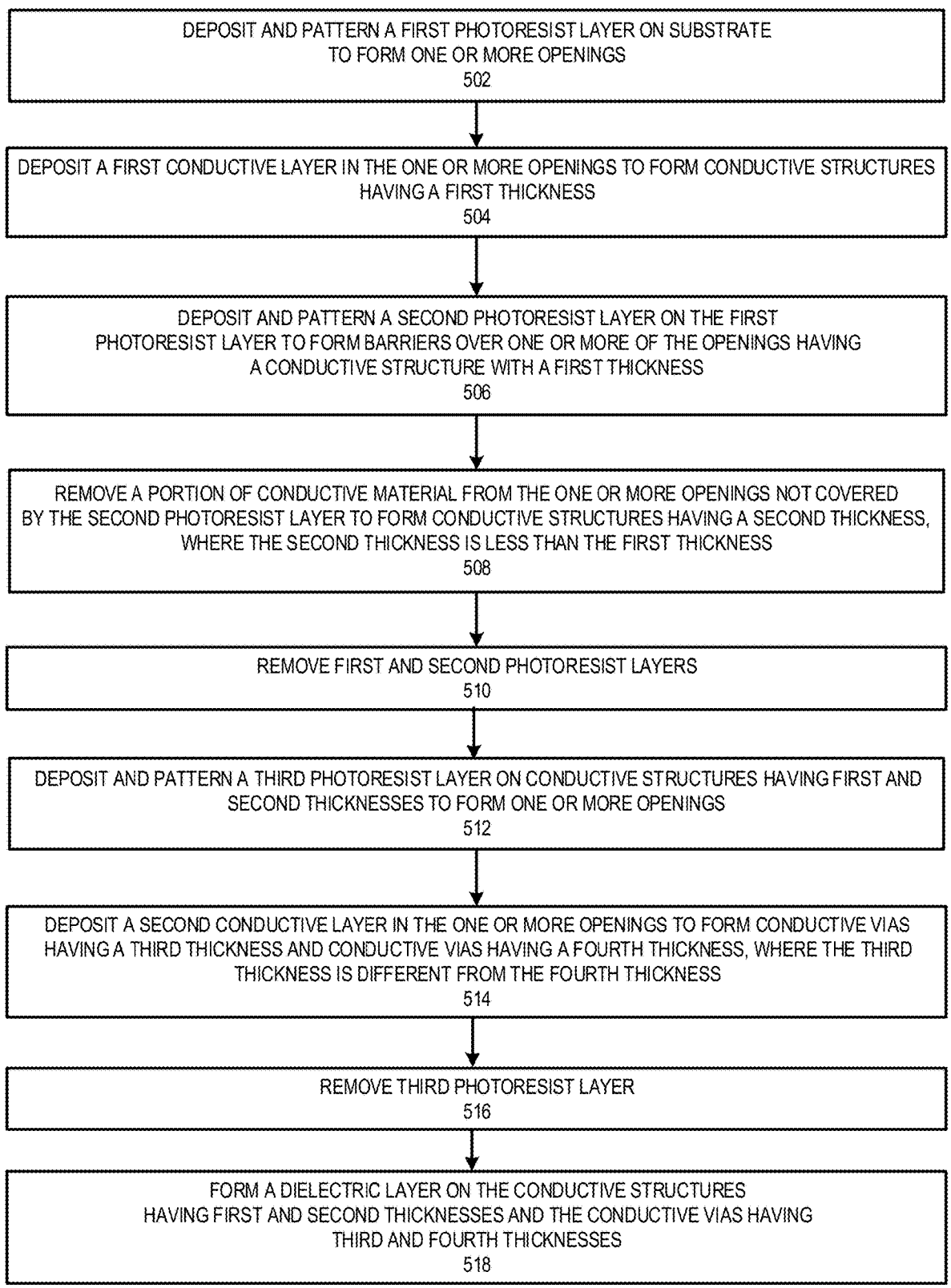
FIG. 5 is a process flow diagram of an example method of forming a microelectronic assembly, in accordance with various embodiments.

FIG. 5 is a process flow diagram of an example method of forming a microelectronic assembly including a substrate with a plurality of conductive structures having different thicknesses, in accordance with various embodiments. At 502, deposit and pattern a first photoresist layer on a substrate to create one or more openings for forming conductive structures. At 504, deposit a conductive material, such as copper, in the one or more openings to form one or more conductive structures having a first thickness. In some embodiments, a seed layer may be deposited before depositing the photoresist material and the conductive material. At 506, deposit and pattern a second photoresist layer on the first photoresist layer to form a covering or a barrier over one or more of the openings having a conductive structure with a first thickness. At 508, remove a portion of the conductive material from the one or more openings not covered by the second photoresist layer to form one or more conductive structures having a second thickness, where the second thickness is less than the first thickness. In some embodiments, the conductive material may be removed by chemical etching. A photoresist layer may be deposited, patterned by exposure to, for example, ultraviolet light, where non-masked regions for openings that correspond to the conductive structures. Conductive structures are formed by depositing conductive material, such as metal, in the openings by, for example, electrolytic plating. Conductive structures having a thickness less than the first and second thicknesses may be formed by repeating the process as described in 506 through 508 to form any number of photoresist layers and conductive structures having smaller thicknesses. At 510, remove the first and second photoresist layers to expose the one or more conductive structures having the first thickness and the one or more conductive structures having the second thickness. Optionally, form conductive vias coupled to the conductive structures having first and second thicknesses using a lithography process as described at 512-518. For example, at 512, deposit and pattern a third photoresist layer on the conductive structure having different thicknesses (e.g., different from the first and second thicknesses) to provide one or more openings to form one or more conductive pillars or vias. At 514, deposit conductive material (e.g., a second conductive layer) in the one or more openings to form the one or more conductive vias having a third thickness and a fourth thickness, where the third thickness is different from the fourth thickness. At 516, remove the third photoresist layer. At 518, form a dielectric layer on the conductive structure and the conductive vias, where the conductive structures have different thicknesses (e.g., first and second thicknesses) and the conductive vias have different thicknesses (e.g., third and fourth thicknesses).

Figure 6A:
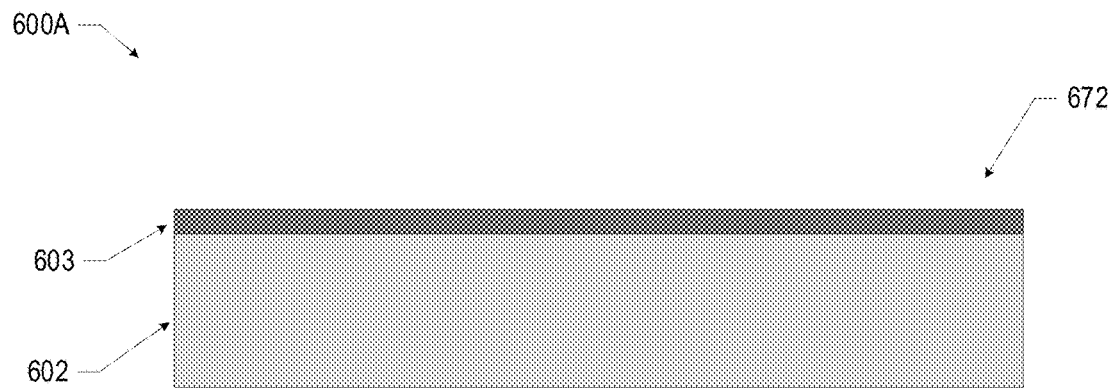
FIGS. 6A-6F are side, cross-sectional views of various stages in an example process for manufacturing a microelectronic assembly, in accordance with various embodiments.

FIG. 6A illustrates an assembly 600A including a substrate 602 subsequent to depositing a seed layer 603 on a top surface 672 of the substrate 602. The seed layer 603 may be any suitable conductive material, including copper. The seed layer 603 may be formed by depositing conductive material using any suitable technique, including, for example, electroplating, sputtering, or electroless plating. In some embodiments, the seed layer 603 may be omitted. In some embodiments, the top surface of the substrate 602 is a dielectric layer in a package substrate.

Figure 6B:
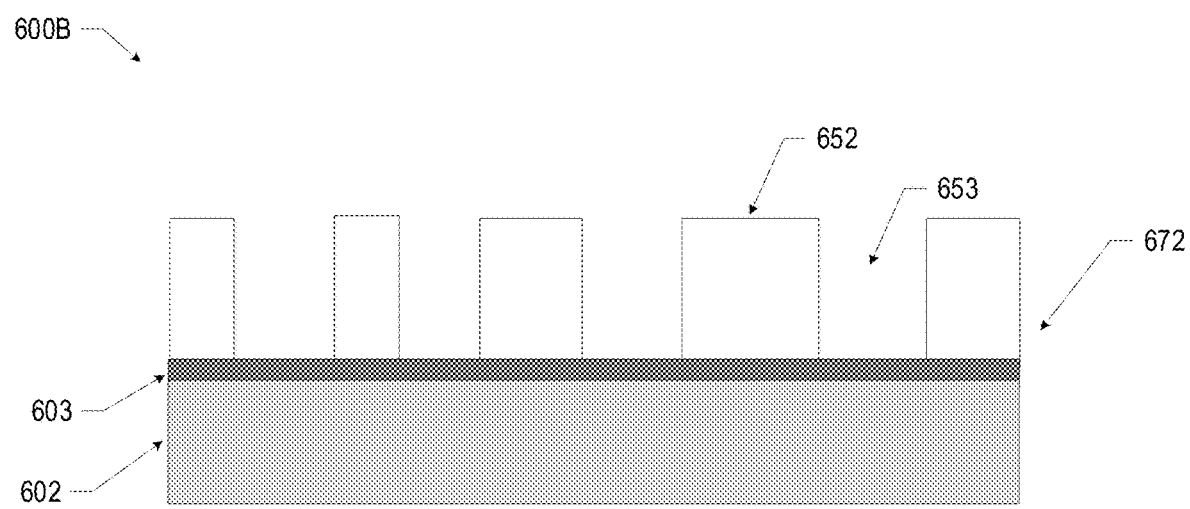

FIG. 6B illustrates an assembly 600B subsequent to depositing a first photoresist material 652 on the top surface 672 of the substrate 602, and patterning the first photoresist material 652 to provide openings 653 for the formation of conductive features (e.g., conductive traces). The first photoresist material 652 may be any suitable material, such as DFR, and may be patterned using any suitable technique, including a lithographic process (e.g., exposing the first photoresist material to a radiation source through a mask and developing with a developer). For example, the first photoresist material 652 may be deposited using lamination and may be positively or negatively charged to create crosslinked and non-crosslinked portions using ultraviolet for patterning conductive material layer. The non-crosslinked portions dissolve to form openings 653 where conductive material may be deposited. The openings 653 may have any suitable size and shape for forming a conductive feature having desired characteristics. For example, openings 653 may be shaped to form a conductive trace having a particular size and shape, such as a rectilinear shape.

Figure 6C:
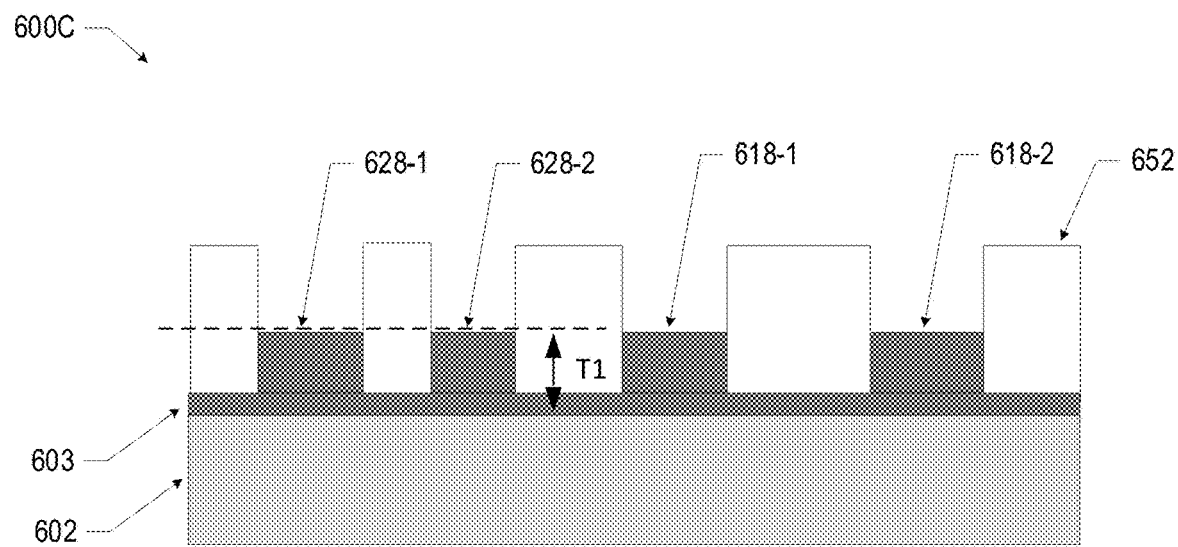

FIG. 6C illustrates an assembly 600C subsequent to depositing a first conductive layer or material in the openings 653 for the formation of conductive features having a first thickness (e.g., T1), including conductive features 618-1, 618-2, 628-1, 628-2. The conductive features 618, 628 may be formed by depositing conductive material in the openings 653 using any suitable technique, including, for example, electroplating, sputtering, or electroless plating. The conductive features 618, 628 may be formed from any suitable conductive material, for example, copper (Cu), aluminum (Al), gold (Au), silver (Ag), and/or alloys thereof. The conductive material may have any suitable thickness (e.g., in some embodiments, a thickness between 1 um and 45 um). The conductive features may include conductive pads and/or traces; for example, conductive feature 628 may include a trace electrically coupled to a power plane or a ground plane (not shown).

Figure 6D:
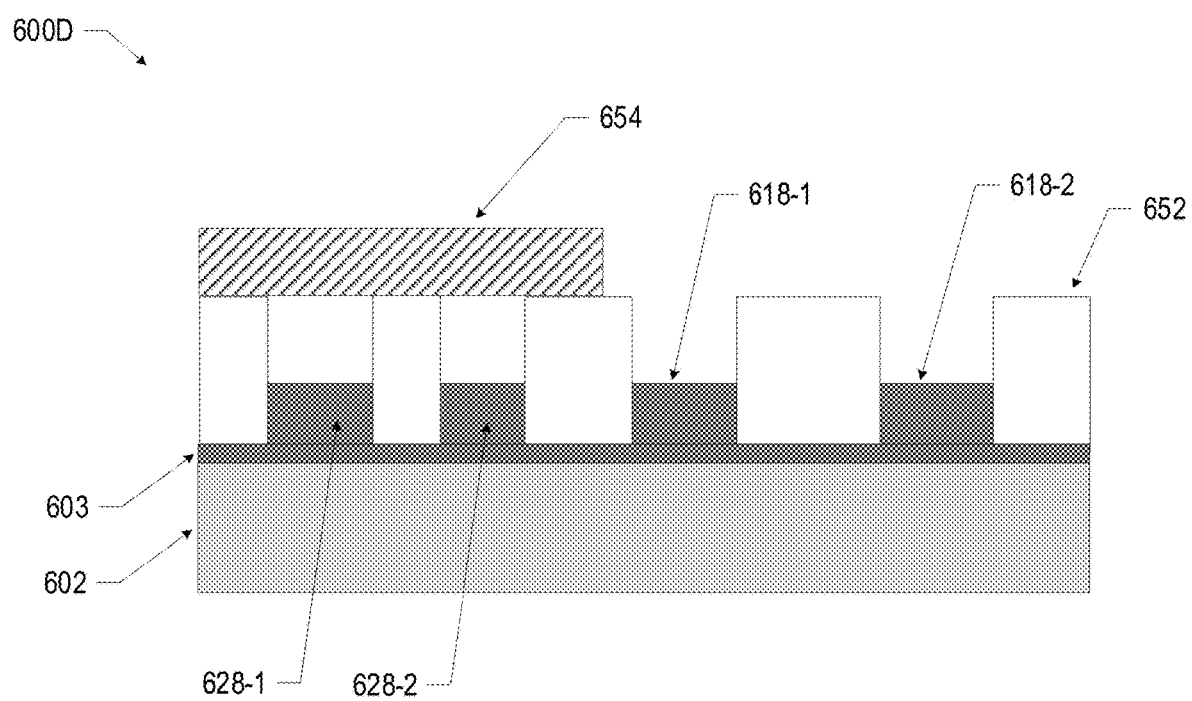

FIG. 6D illustrates an assembly 600D subsequent to depositing a second photoresist material 654 on the first photoresist material 652 and patterning the second photoresist material 654 to mask or cover a particular region, such as conductive features 628-1, 628-2. The second photoresist material 654 may act as a barrier to prevent additional conductive material from being deposited on the conductive features 628. As described above with reference to FIG. 6B, the second photoresist material 654 may be any suitable material, such as DFR, and may be patterned using any suitable technique, including a lithographic process.

Figure 6E:
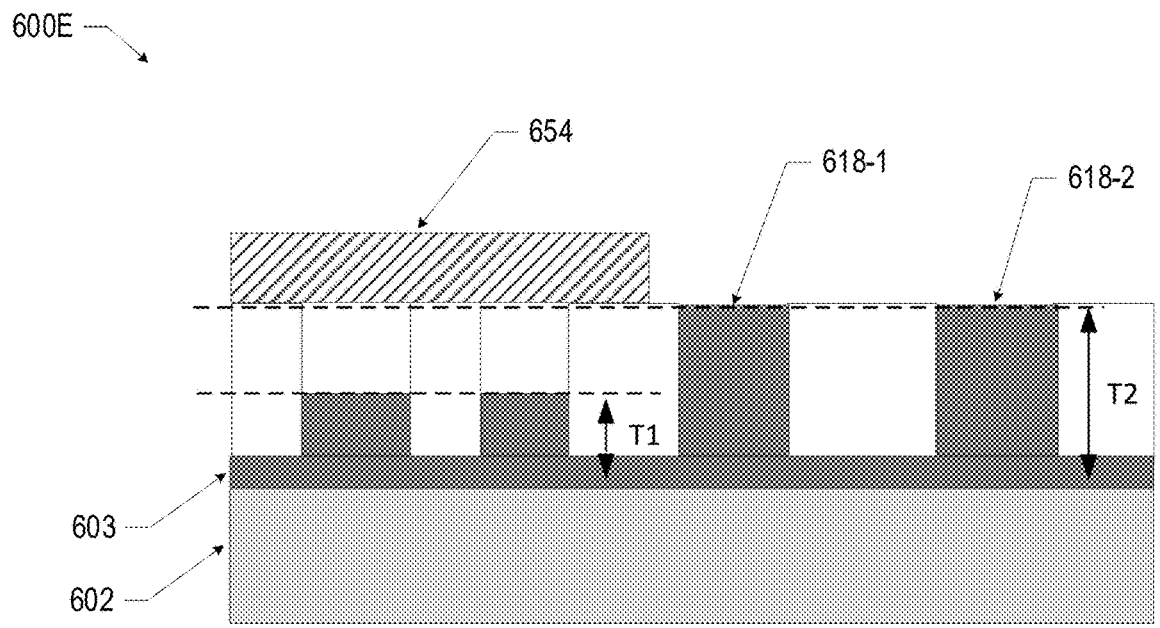

FIG. 6E an assembly 600E subsequent to depositing a second conductive layer or material in the openings 653 for the formation of conductive features 618-1, 618-2 having a second thickness (e.g., T2), where the second thickness is greater than the first thickness. The second photoresist material 654 may prevent the second conductive layer from being deposited on conductive features 628-1, 628-2, so that conductive features 628 may have a smaller thickness (e.g., T1) as compared to conductive features 618-1, 618-2 (e.g., T2). Other conductive features having a greater thickness than conductive features 618 may be formed by repeating the process described in FIGS. 6D-6E to add additional photoresist layers and additional conductive layers. For example, a third photoresist layer (not shown) may be deposited and patterned to cover conductive feature 618-1, and a third conductive layer (not shown) may be deposited on conductive feature 618-2 to form a thicker conductive feature as compared with 618-1, 628-1, 628-2 having first and second thicknesses.

Figure 6F:
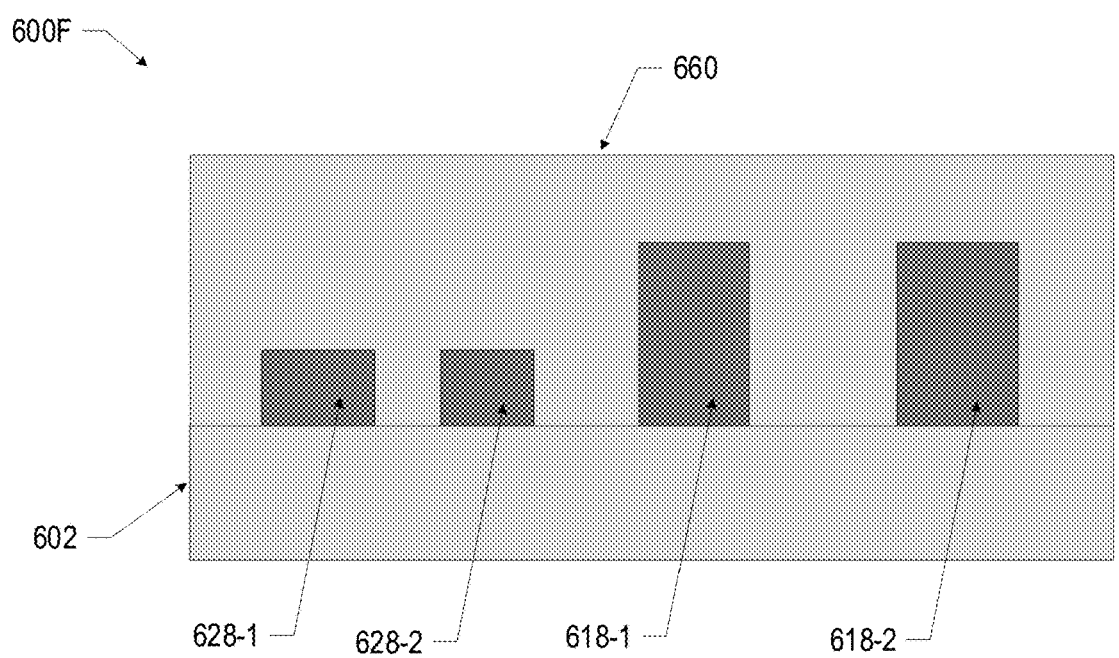

FIG. 6F illustrates an assembly 600F subsequent to stripping the first and second photoresist materials 652, 654 to expose the conductive features 618, 628, removing the exposed portions of the seed layer, and forming a dielectric layer 660 over a top surface of the assembly 600E, including the conductive features 618, 628. The exposed portions of the seed layer may be removed using any suitable process, including chemical etching, among others. In some embodiments, the top surfaces of the conductive features may be planarized or polished. The dielectric layer 660 may be formed using any suitable process, including lamination, or slit coating and curing, as described above with reference to FIG. 2. Although FIG. 6F shows particular conductive features 618, 628, the conductive features may take any form, including a conductive plane, or a conductive via. Additional layers may be built up in the package substrate by repeating the process as described with respect to FIG. 2, FIG. 4, or by any suitable process, which is known in the art.

Figure 7:
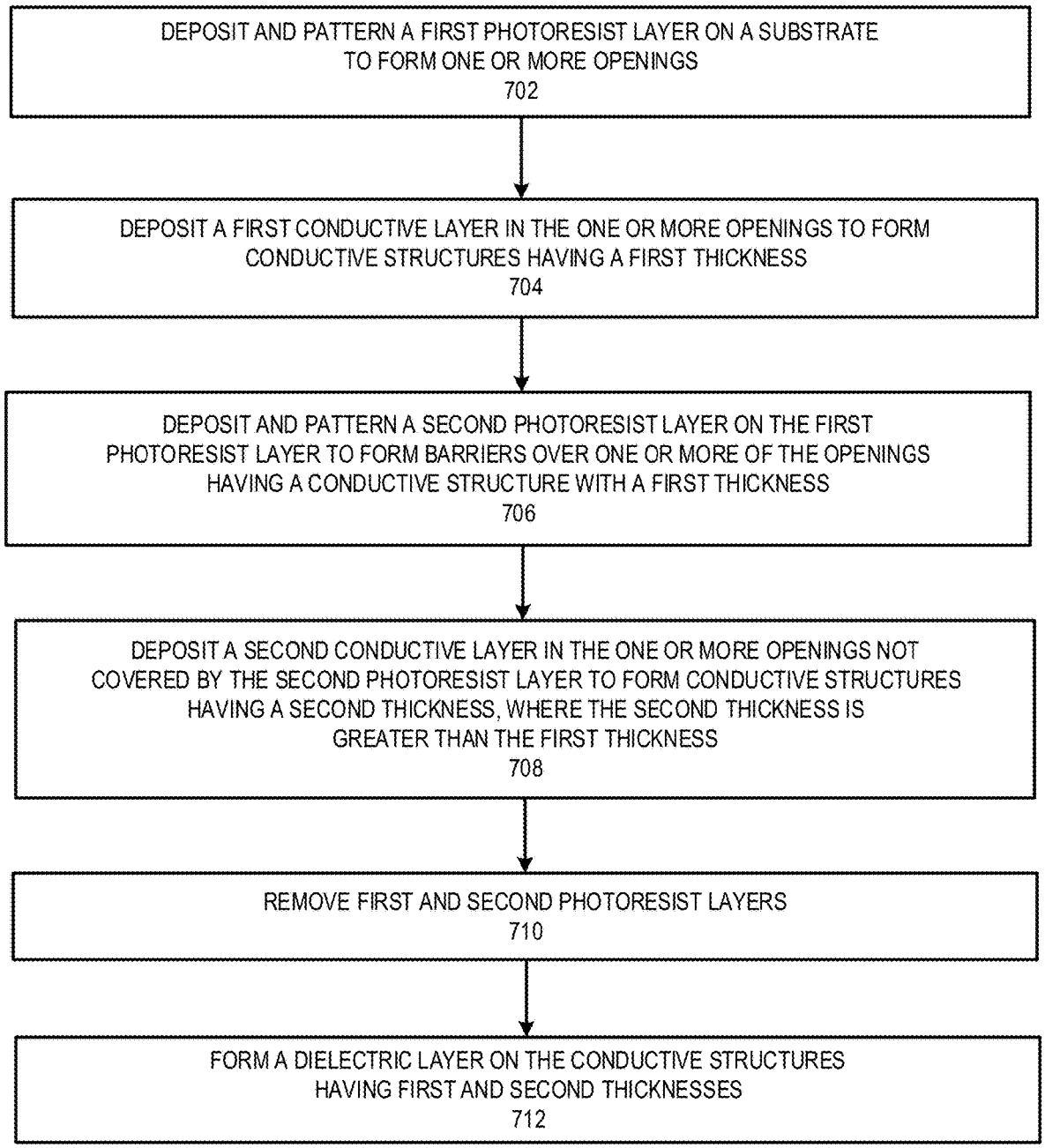
FIG. 7 is a process flow diagram of an example method of forming a microelectronic assembly, in accordance with various embodiments.

FIG. 7 is a process flow diagram of an example method of forming a microelectronic assembly including a core with a plurality of conductive structures having different thicknesses, in accordance with various embodiments. At 702, deposit and pattern a first photoresist layer on a substrate to form one or more openings. At 704, deposit a first conductive material, such as copper, in the one or more openings to form one or more conductive structures having a first thickness. In some embodiments, a seed layer may be deposited before depositing the first conductive layer. At 706, deposit and pattern a second photoresist layer on the first photoresist layer to form a covering or a barrier over one or more openings having a conductive structure with a first thickness. At 708, deposit a second conductive layer, such as copper, in the one or more openings not covered by the second photoresist layer to form one or more conductive structures having a second thickness, where the second thickness is greater than the first thickness. At 710, remove the first and second photoresist layers to expose the conductive structures. Additional conductive structures having a thickness greater than the second thickness may be formed by repeating the process as described in 706 through 708 to form any number of photoresist layers and conductive layers. At 712, form a dielectric layer on the one or more conductive structures, where the conductive structures have first and second thicknesses. Conductive vias coupled to the conductive structures having first and second thicknesses may be formed using any suitable process as described above with reference to FIGS. 2-4. Additional conductive layers having conductive structures with different thicknesses may be formed by repeating the process as described in 702 through 712, or by any suitable process. The finished substrate may be a single package substrate or may be a repeating unit that may undergo a singulation process in which each unit is separated for one another to create a single package substrate.

Figure 8A:
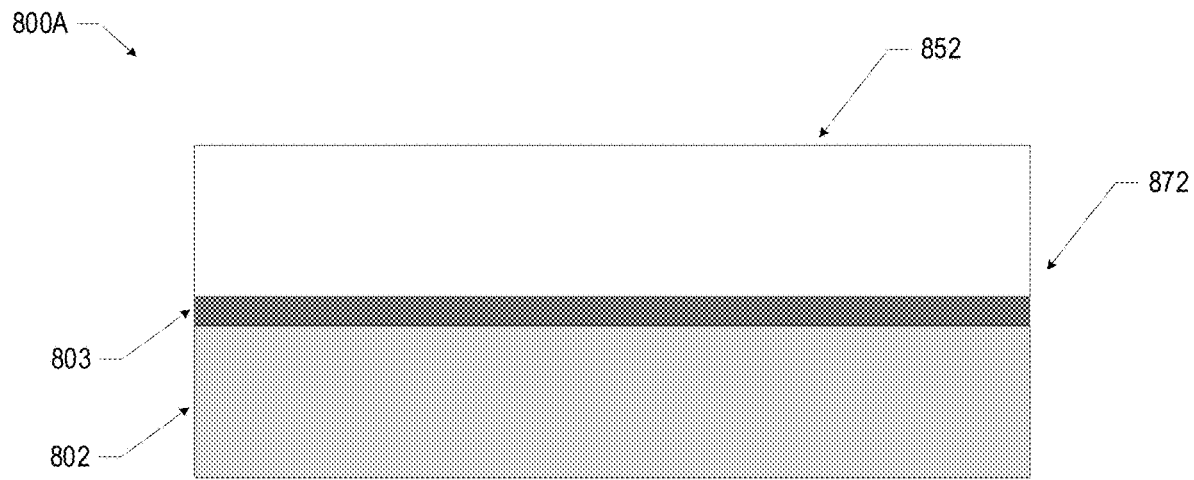
FIGS. 8A-8H are side, cross-sectional views of various stages in an example process for manufacturing a microelectronic assembly, in accordance with various embodiments.

FIG. 8A illustrates an assembly 800A including a substrate 802 subsequent to depositing a seed layer 803 on a top surface 872 of the substrate 802, and depositing a dose-selective photoresist material 852 on the top surface of the seed layer 803. The seed layer 803 may be any suitable conductive material, including copper. The seed layer 803 may be formed by depositing conductive material using any suitable technique, including, for example, electroplating, sputtering, or electroless plating. In some embodiments, the seed layer 803 may be omitted. The dose-selective photoresist material 852 may be any suitable material that may be patterned based on radiation levels, such as a positive tone resist. The selective patterning of the photoresist may be performed based on exposing regions of the resist to different radiation levels using a grayscale mask (e.g., high dose, medium dose, and/or low dose). The high-dose regions may be developed in a first development step, and a first conductive material may be deposited in the high-dose openings to form high-dose structures. The low-dose regions may be developed in a second development step, which may be longer than the first development step, and a second conductive material may be deposited in the low-dose openings, as well as the high-dose openings, to form low-dose structures. Subsequent to forming the conductive structures, the dose-selective photoresist may be removed. In some embodiments, a negative tone resist may be used. In some embodiments, a variable laser power or a wavelength selective resist (e.g., a resist compatible with specific energies) may be used.

Figure 8B:
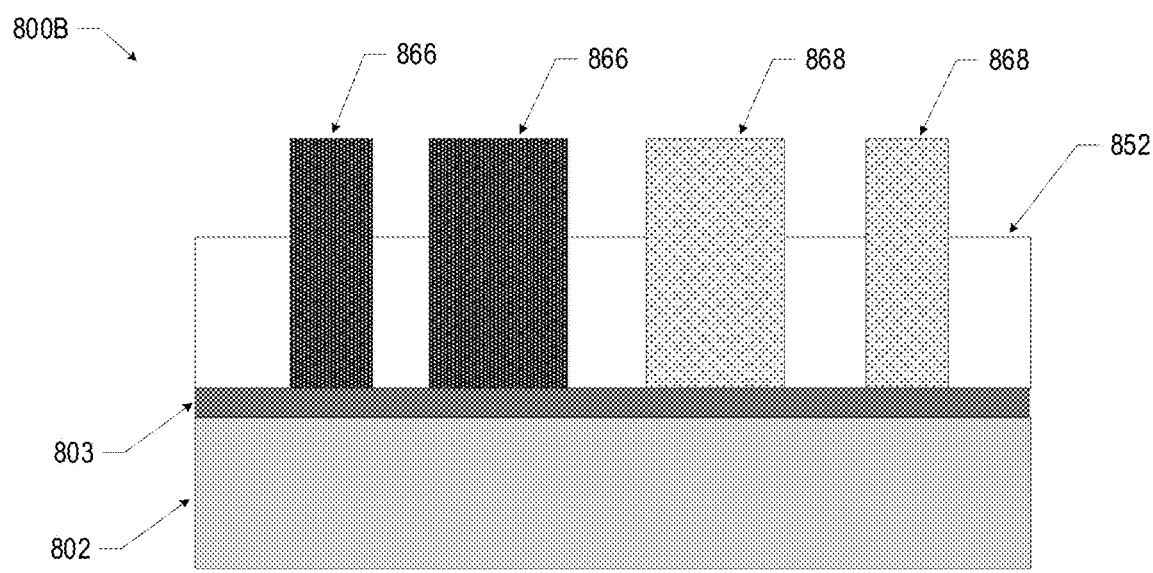

FIG. 8B illustrates an assembly 800B subsequent to exposing the photoresist material 852 to multiple radiation levels 866, 868. For example, the photoresist material 852 may be exposed to a high-dose radiation level 866 and a low-dose radiation level 868. The selective patterning may be performed, for example, by modulating the develop time, where a fast develop is used to develop the area for which a low dose is applied and a slow develop is used to develop the area for which a high dose is applied.

Figure 8C:
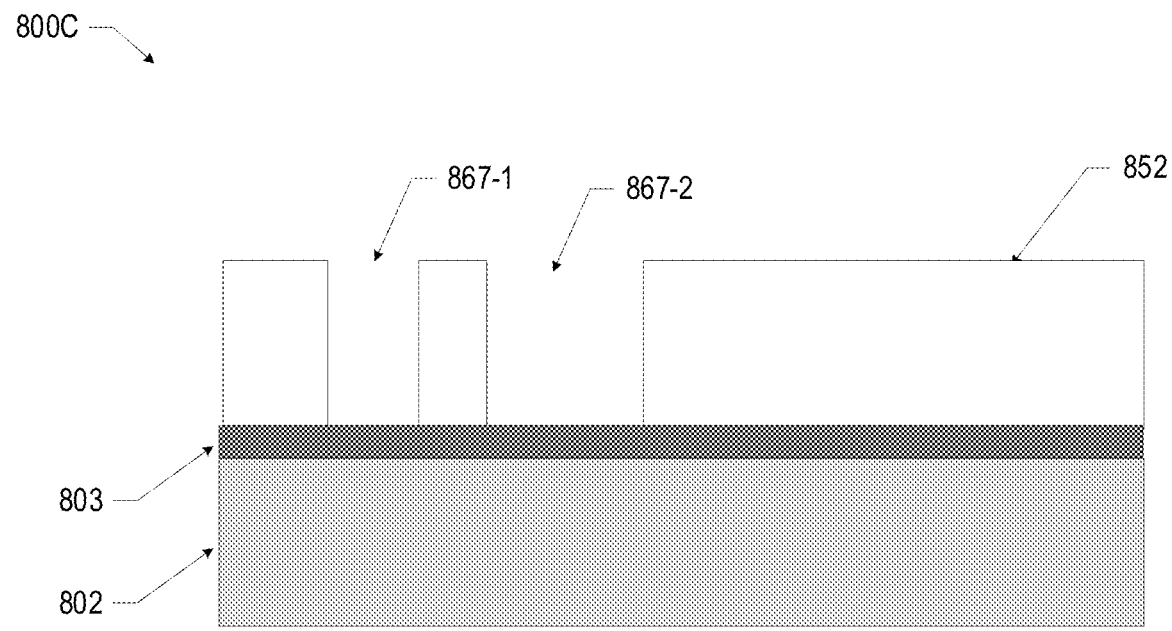

FIG. 8C illustrates an assembly 800C subsequent to performing a first development to provide first openings 867-1, 867-2 in the regions of the photoresist material 852 exposed to high-dose radiation levels 866 for the formation of conductive features (e.g., conductive traces). The regions exposed to high-dose radiation levels 866 dissolve to form first openings 867-1, 867-2 where conductive material may be deposited. The first openings 867-1, 867-2 may have any suitable size and shape for forming a conductive feature having desired characteristics. For example, the first openings 867-1, 867-2 may be shaped to form a conductive trace having a particular size and shape. In some embodiments, the first openings 867-1, 867-2 may have the same size and/or shape. In some embodiments, the first openings 867-1, 867-2 may have different sizes and/or different shapes.

Figure 8D:
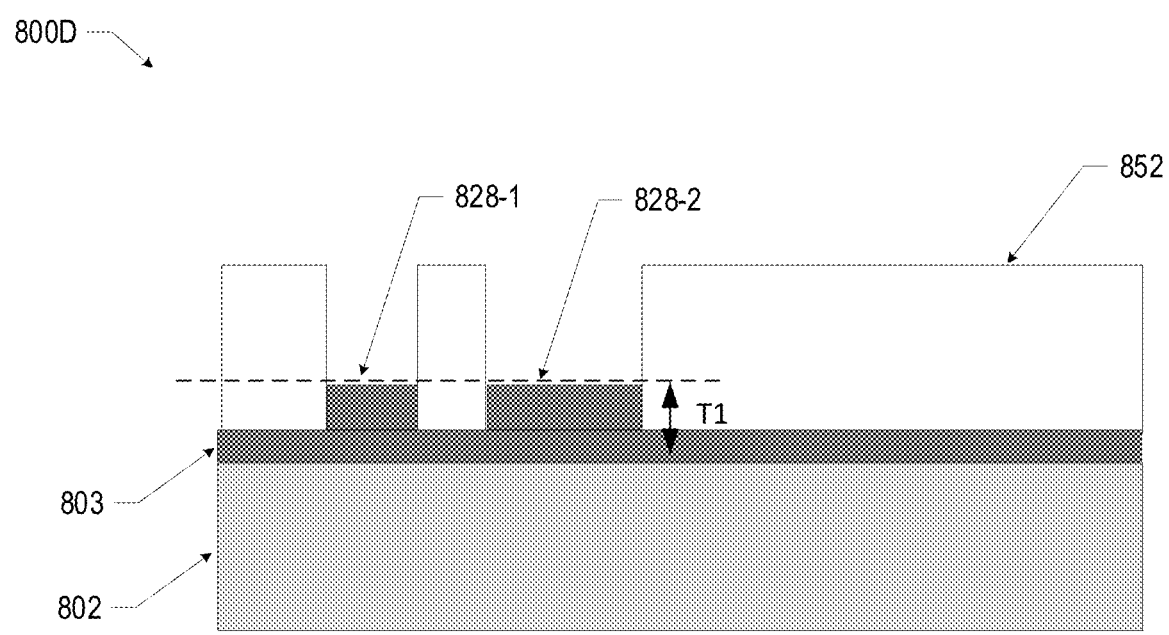

FIG. 8D illustrates an assembly 800D subsequent to depositing a first conductive layer or material in the first openings 867 for the formation of conductive features 828-1, 828-2 having a first thickness T1. The conductive features 828 may be formed by depositing conductive material in the first openings 867 using any suitable technique, including, for example, electroplating, sputtering, or electroless plating. The conductive features 828 may be formed from any suitable conductive material, for example, copper (Cu), aluminum (Al), gold (Au), silver (Ag), and/or alloys thereof. The conductive material may have any suitable thickness (e.g., in some embodiments, a thickness between 1 um and 45 um). The conductive features may include conductive pads and/or traces (not shown).

Figure 8E:
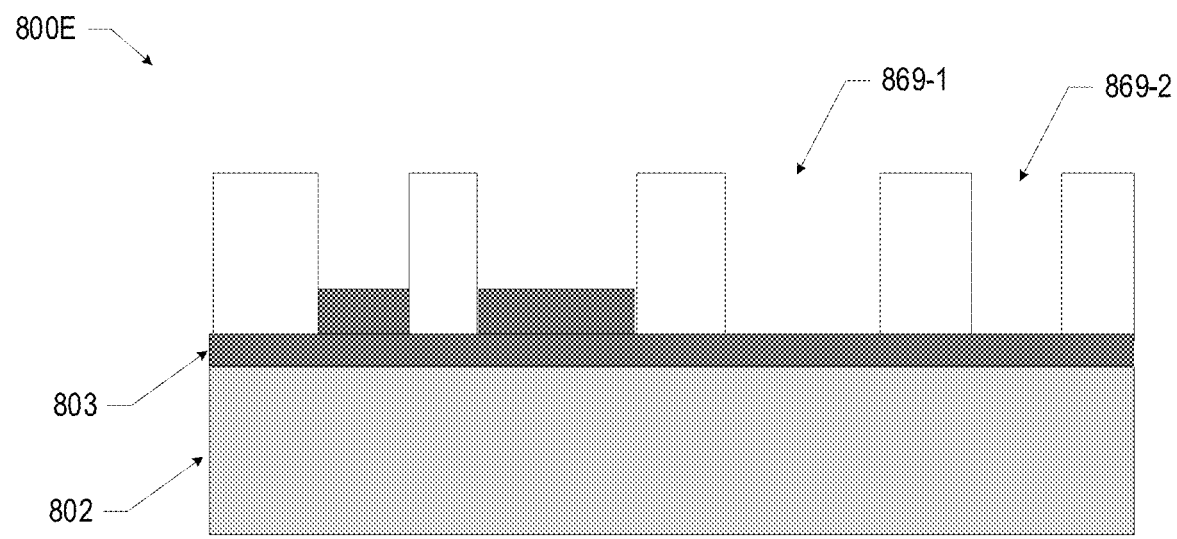

FIG. 8E illustrates an assembly 800E subsequent to performing a second development to provide second openings 869-1, 869-2 in the regions of the photoresist material 852 exposed to low-dose radiation levels 868 for the formation of conductive features (e.g., conductive traces). The regions exposed to ow-dose radiation levels 868 dissolve to form second openings 869-1, 869-2 where conductive material may be deposited. The second openings 869-1, 869-2 may have any suitable size and shape for forming a conductive feature having desired characteristics. For example, second openings 869-1, 869-2 may be shaped to form a conductive trace having a particular size and shape. In some embodiments, the second openings 869-1, 869-2 may have the same size and/or shape. In some embodiments, the second openings 869-1, 869-2 may have different sizes and/or different shapes. In some embodiments, the first openings 867-1, 867-2 and second openings 869-1, 869-2 may have different sizes and different shapes. In some embodiments, the first openings 867-1, 867-2 and second openings 869-1, 869-2 may have the same sizes and shapes.

Figure 8F:
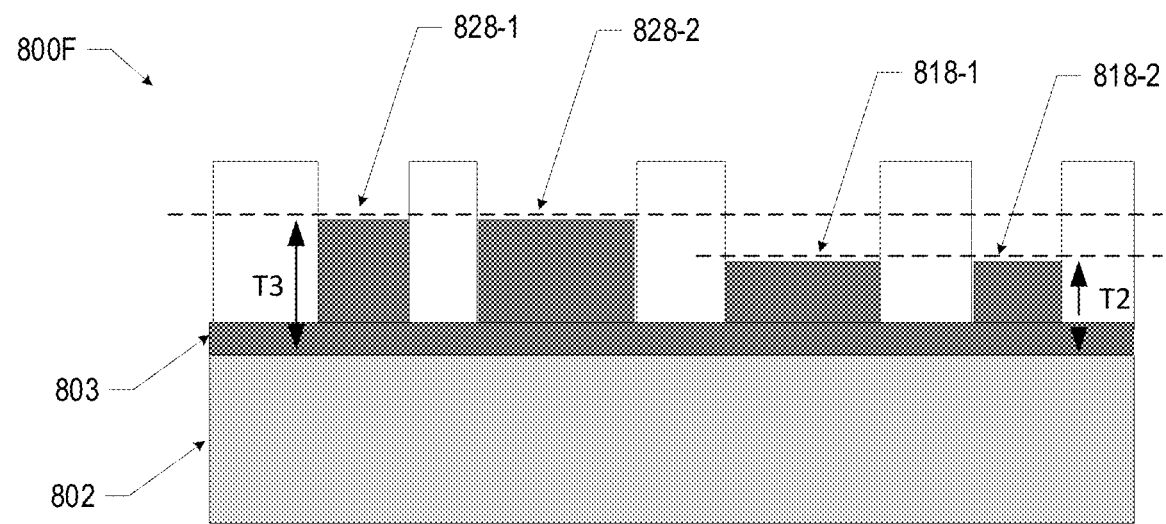

FIG. 8F illustrates an assembly 800F subsequent to depositing a second conductive layer or material in the second openings 869 for the formation of conductive features 818-1, 818-2 having a second thickness T2, and in the first openings 867 for the formation of conductive features 828-1, 828-2 having a third thickness T3. The conductive features 818, 828 may be formed by depositing conductive material in the first and second openings 867, 869 using any suitable technique and any suitable material, as described above with reference to FIG. 8D. The first and second conductive material may have any suitable thicknesses (e.g., in some embodiments, a thickness between 1 um and 45 um). In some embodiments, a first thickness T1 of the first conductive material may be the same as a second thickness T2 of the second conductive material, such that a third thickness T3 is twice the first thickness T1 or twice the second thickness T2. In some embodiments, a first thickness T1 of the first conductive material may be different from a second thickness T2 of the second conductive material. Other conductive features having a thickness different from the second and third thicknesses (e.g., T2 and T3) may be formed by exposing the photoresist to a third radiation level and repeating the process described in FIGS. 8E-8F to add additional conductive layers.

Figure 8G:
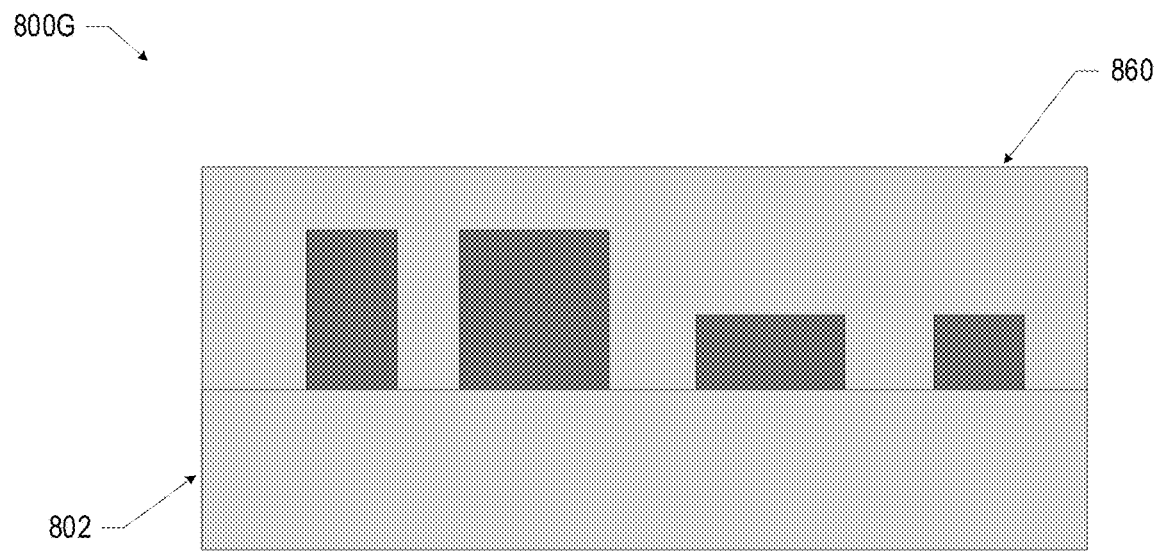

FIG. 8G illustrates an assembly 800G subsequent to stripping the photoresist material 852 to expose the conductive features 818, 828, removing the exposed portions of the seed layer 803, and forming a dielectric layer 860 over a top surface of the assembly 800F, including the conductive features 818, 828. The exposed portions of the seed layer 803 may be removed using any suitable process, including chemical etching, among others. In some embodiments, the top surfaces of the conductive features may be planarized or polished. The dielectric layer 860 may be formed using any suitable process, including lamination, or slit coating and curing, as described above with reference to FIG. 2. Although FIG. 8G shows a particular number and arrangement of conductive features 818, 828, the conductive features may take any form and any arrangement, including a conductive plane, or a conductive via.

Figure 8H:
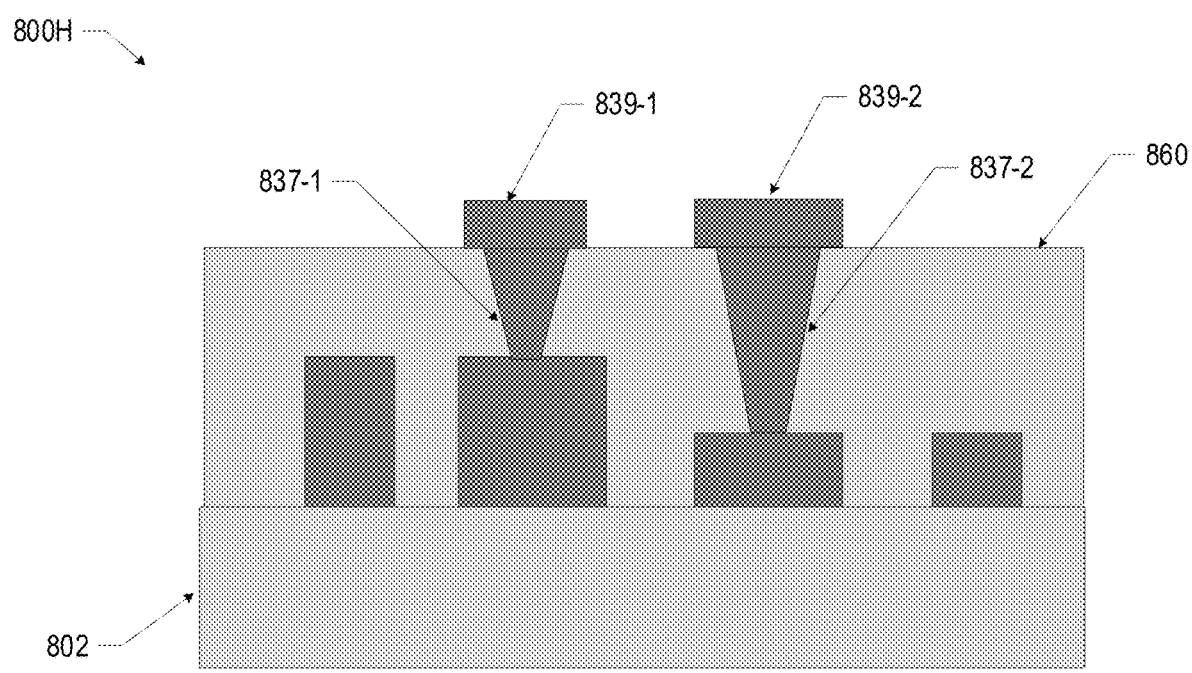

Additional layers may be built up in the package substrate by repeating the process as described with respect to FIG. 2, FIG. 4, or by any suitable process, which is known in the art. For example, FIG. 8H illustrates an assembly 800H subsequent to laser drilling to form openings in the dielectric layer 860, and depositing conductive material in the openings to form vias 837-1, 837-2 and contact pads 839-1, 839-2 on assembly 800G.

Figure 9:
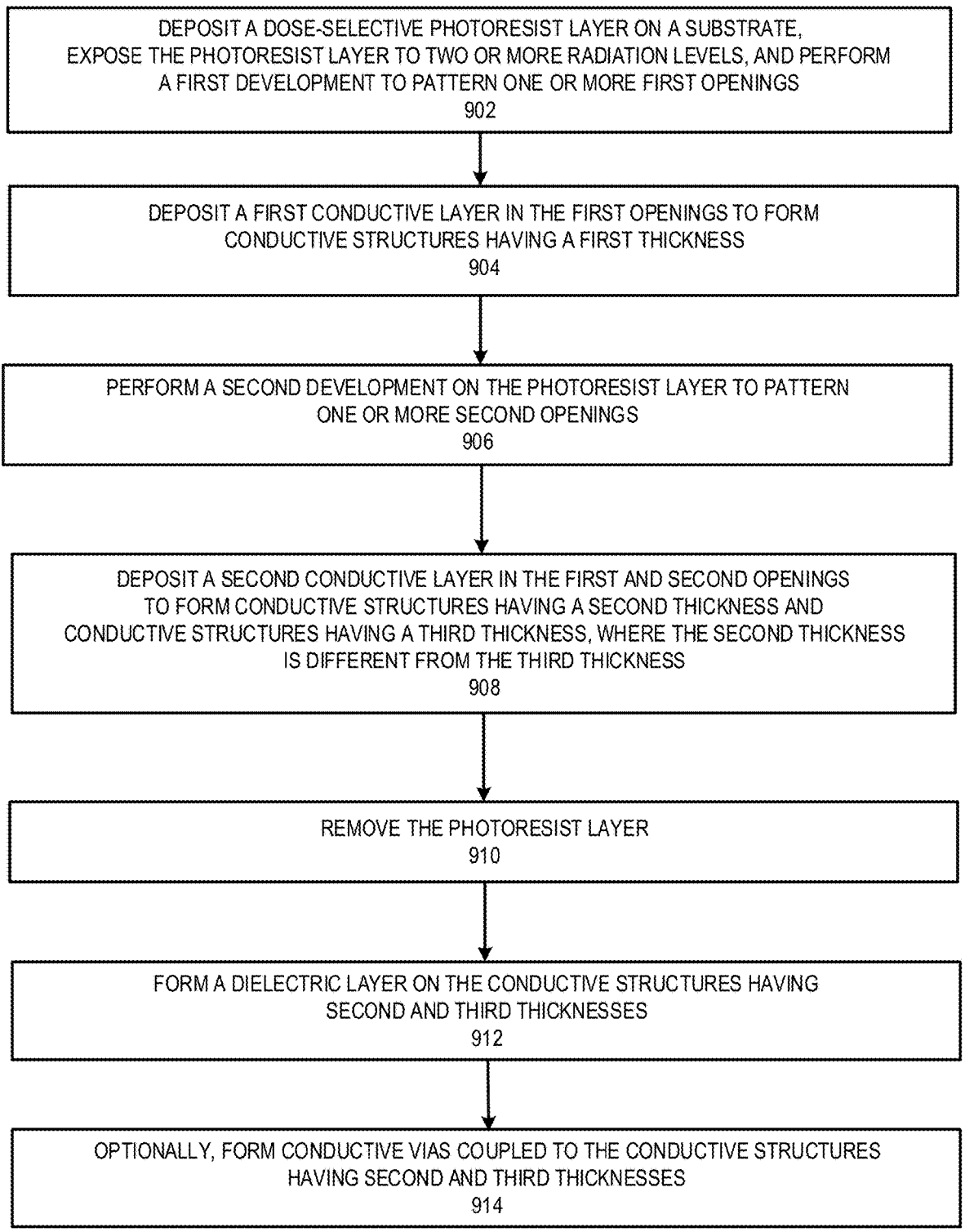
FIG. 9 is a process flow diagram of an example method of forming a microelectronic assembly, in accordance with various embodiments.

FIG. 9 is a process flow diagram of an example method of forming a microelectronic assembly including a substrate with conductive structures on a same layer having different thicknesses, in accordance with various embodiments. At 902, deposit a dose-selective photoresist layer on a substrate, expose the dose-selective photoresist layer to two or more radiation levels, and perform a first development to form one or more first openings. At 904, deposit a first conductive material, such as copper, in the one or more first openings to form one or more conductive structures having a first thickness. In some embodiments, a seed layer may be deposited before depositing the first conductive layer. At 906, perform a second development on the dose-selective photoresist layer to from one or more second openings. At 908, deposit a second conductive layer, such as copper, in the one or more second openings to form one or more conductive structures having a second thickness and in the one or more first openings to form one or more conductive structures having a third thickness, where the second thickness is different from the third thickness. At 910, remove the dose-selective photoresist layer to expose the conductive structures having second and third thicknesses. Additional conductive structures having a thickness greater than the second thickness may be formed by repeating the process as described in 906 through 908 to form any number of conductive structure thicknesses. At 912, form a dielectric layer on the one or more conductive structures having second and third thicknesses. At 914, optionally, form conductive vias coupled to the conductive structures having second and third thicknesses, using any suitable process as described above with reference to FIGS. 2-4. Additional conductive layers having conductive structures with different thicknesses may be formed by repeating the process as described in 902 through 912, or by any suitable process. The finished substrate may be a single package substrate or may be a repeating unit that may undergo a singulation process in which each unit is separated for one another to create a single package substrate.

The microelectronic assemblies disclosed herein may be used for any suitable application. For example, in some embodiments, a microelectronic assembly may include a die that may be used to provide an ultra-high density and high bandwidth interconnect for field programmable gate array (FPGA) transceivers and III-V amplifiers. In an example, a microelectronic assembly may include a die that may be a processing device (e.g., a CPU, a radio frequency chip, a power converter, a network processor, a GPU, a FPGA, a modem, an applications processor, etc.), and the die may include high bandwidth memory, transceiver circuitry, and/or input/output circuitry (e.g., Double Data Rate transfer circuitry, Peripheral Component Interconnect Express circuitry, etc.).

In another example, a microelectronic assembly may include a die that may be a cache memory (e.g., a third-level cache memory), and one or more dies that may be processing devices (e.g., a CPU, a radio frequency chip, a power converter, a network processor, a GPU, a FPGA, a modem, an applications processor, etc.) that share the cache memory of the die.

Figure 10:
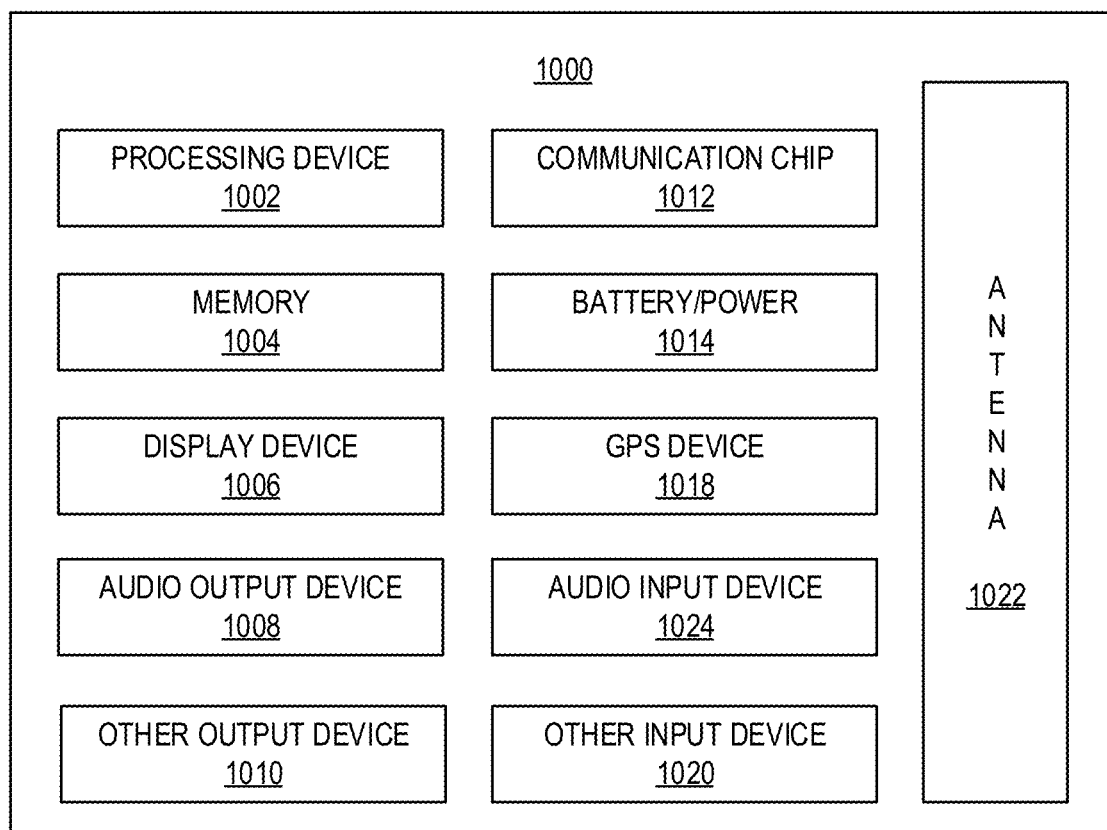
FIG. 10 is a block diagram of an example electrical device that may include a microelectronic assembly, in accordance with any of the embodiments disclosed herein.

The microelectronic assemblies disclosed herein may be included in any suitable electronic component. FIG. 10 is a block diagram of an example electrical device 1000 that may include one or more of the microelectronic assemblies disclosed herein. For example, any suitable ones of the components of the electrical device 1000 may be arranged in any of the microelectronic assemblies disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards. In some embodiments, some or all of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include a processing device 1002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1002 may include one or more digital signal processors (DSPs), ASICs, CPUs, GPUs, cryptoprocessors (specialized processors that execute cryptographic algorithms within hardware), server processors, or any other suitable processing devices. The electrical device 1000 may include a memory 1004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1004 may include memory that shares a die with the processing device 1002. This memory may be used as cache memory and may include embedded dynamic random access memory (eDRAM) or spin transfer torque magnetic random access memory (STT-MRAM).

In some embodiments, the electrical device 1000 may include a communication chip 1012 (e.g., one or more communication chips). For example, the communication chip 1012 may be configured for managing wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1012 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as global positioning system (GPS), EDGE, GPRS, CDMA, WiMAX, LTE, EV-DO, or others. In some embodiments, a first communication chip 1012 may be dedicated to wireless communications, and a second communication chip 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any device that generates an audible indicator, such as speakers, headsets, or earbuds.

The electrical device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The electrical device 1000 may include a GPS device 1018 (or corresponding interface circuitry, as discussed above). The GPS device 1018 may be in communication with a satellite-based system and may receive a location of the electrical device 1000, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1000 may have any desired form factor, such as a portable, hand-held, or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1000 may be any other electronic device that processes data.

The following paragraphs provide various examples of the embodiments disclosed herein.

Example 1 is a microelectronic assembly, including: a substrate layer having a surface; a first conductive trace having a first thickness on the surface of the substrate layer; and a second conductive trace having a second thickness on the surface of the substrate layer, wherein the second thickness is different from the first thickness.

Example 2 may include the subject matter of Example 1, and may further specify that the second thickness is greater than the first thickness.

Example 3 may include the subject matter of Example 1, and may further specify that the first thickness is between 1 um and 35 um.

Example 4 may include the subject matter of Example 1, and may further specify that the second thickness is between 4 um and 70 um.

Example 5 may include the subject matter of Example 1, and may further specify that the second conductive trace is electrically coupled to a power plane or a ground plane.

Example 6 may include the subject matter of Example 1, and may further specify that the first and second conductive traces have rectangular cross-sections.

Example 7 may include the subject matter of Example 1, and may further specify that the substrate layer is a dielectric layer in a package substrate.

Example 8 is a microelectronic assembly, including: a package substrate having a layer; a first conductive feature having a first thickness in the layer of the package substrate, wherein the first conductive feature is rectilinear; and a second conductive feature having a second thickness in the layer of the package substrate, wherein the second conductive feature is rectilinear, and wherein the second thickness is different from the first thickness.

Example 9 may include the subject matter of Example 8, and may further specify that the first conductive feature is a trace.

Example 10 may include the subject matter of Example 8, and may further specify that the second conductive feature is electrically coupled to a power plane or a ground plane.

Example 11 may include the subject matter of Example 8, and may further include: a die electrically coupled to the package substrate.

Example 12 may include the subject matter of Example 11, and may further specify that the die is a central processing unit, a radio frequency chip, a power converter, or a network processor.

Example 13 may include the subject matter of Example 11, and may further specify that the first conductive feature is electrically coupled to the die via conductive pathways in the package substrate.

Example 14 may include the subject matter of Example 13, and may further specify that the second conductive feature is electrically coupled to the die via conductive pathways in the package substrate.

Example 15 is a computing device, including: a package substrate having a first surface and an opposing second surface, the package substrate including: a first conductive trace having a first thickness in a layer of the package substrate, wherein the first conductive trace is rectilinear; and a second conductive trace having a second thickness in the layer of the package substrate, wherein the second conductive trace is rectilinear, and wherein the second thickness is different from the first thickness; a circuit board coupled to the first surface of the package substrate; and a die coupled to the second surface of the package substrate.

Example 16 may include the subject matter of Example 15, and may further specify that the first thickness is between 1 um and 35 um.

Example 17 may include the subject matter of Example 15, and may further specify that the second thickness is between 4 um and 70 um.

Example 18 may include the subject matter of Example 15, and may further specify that the second conductive trace is electrically coupled to a power plane or a ground plane.

Example 19 may include the subject matter of any of Examples 15-18, and may further specify that the computing device is a server device.

Example 20 may include the subject matter of any of Examples 15-18, and may further specify that the computing device is a portable computing device.

Example 21 may include the subject matter of any of Examples 15-18, and may further specify that the computing device is a wearable computing device.

Example 22 is a method of manufacturing a microelectronic assembly, including: depositing and patterning a first photoresist layer on a substrate to form one or more openings; forming a first conductive layer in the one or more openings to form one or more conductive traces having a first thickness, wherein the one or more conductive traces having a first thickness are rectilinear; depositing and patterning a second photoresist layer on the first photoresist layer to cover one or more of the one or more openings; and forming a second conductive layer in the one or more openings not covered by the second photoresist layer to form one or more conductive traces having a second thickness, wherein the one or more conductive traces having a second thickness are rectilinear, and wherein the second thickness is different from the first thickness.

Example 23 may include the subject matter of Example 22, where in the second thickness is greater than the first thickness.

Example 24 may include the subject matter of Example 22, and may further specify that the one or more conductive traces having the first thickness are traces to transmit or to receive a signal.

Example 25 may include the subject matter of Example 22, and may further specify that the one or more conductive traces having the second thickness are traces to couple to a power plane or a ground plane.

Example 26 may include the subject matter of Example 22, and may further include: removing the first and second photoresist layers; forming a dielectric layer on the one or more conductive traces having first and second thicknesses; laser drilling an opening in the dielectric layer; and depositing conductive material in the opening to form a via, wherein the via is coupled to an individual conductive trace having the first thickness.

Example 27 may include the subject matter of Example 22, and may further include: removing the first and second photoresist layers; depositing and patterning a third photoresist layer on the one or more conductive traces having first and second thicknesses to form one or more via openings; depositing a third conductive layer in the one or more via openings to form one or more conductive vias; removing the third photoresist layer; and forming a dielectric layer on the one or more conductive traces having first and second thicknesses and on the one or more conductive vias.

Example 28 is a method of manufacturing a microelectronic assembly, including: depositing and patterning a dose-selective photoresist layer on a substrate; exposing the dose-selective photoresist layer to at least two radiation levels; performing a first development to form one or more first openings in the dose-selective photoresist layer; forming a first conductive layer in the one or more first openings to form one or more conductive features having a first thickness; performing a second development to form one or more second openings in the dose-selective photoresist layer; and forming a second conductive layer in the one or more second openings to form one or more conductive features having a second thickness and in the one or more first openings to form one or more conductive features having a third thickness, wherein the second thickness is different from the third thickness.

Example 29 may include the subject matter of Example 28, where in the third thickness is greater than the second thickness.

Example 30 may include the subject matter of Example 28, and may further specify that the one or more conductive features having the second thickness are traces to transmit or to receive a signal.

Example 31 may include the subject matter of Example 28, and may further specify that the one or more conductive features having the third thickness are traces to couple to a power plane or a ground plane.

Example 32 may include the subject matter of Example 28, and may further include: removing the dose-selective photoresist layer; forming a dielectric layer on the one or more conductive features having second and third thicknesses; laser drilling a via opening in the dielectric layer; and depositing conductive material in the via opening to form a conductive via.

Example 33 may include the subject matter of Example 28, and may further include: removing the dose-selective photoresist layer; depositing and patterning a first photoresist layer on the one or more conductive features having second and third thicknesses to form one or more via openings; depositing a third conductive layer in the one or more via openings to form one or more conductive vias; removing the first photoresist layer; and forming a dielectric layer on the one or more conductive features having second and third thicknesses and on the one or more conductive vias.

Example 34 is a method of manufacturing a microelectronic assembly, including: depositing and patterning a first photoresist layer on a substrate to form one or more openings; depositing a conductive material in the one or more openings to form one or more conductive features having a first thickness; depositing and patterning a second photoresist layer on the first photoresist layer to cover one or more of the conductive features having a first thickness; and removing a portion of the conductive material from the one or more conductive features having the first thickness not covered by the second photoresist layer to form one or more conductive features having a second thickness, wherein the second thickness is different from the first thickness.

Example 35 may include the subject matter of Example 34, and may further specify that the second thickness is less than the first thickness.

Example 36 may include the subject matter of Example 34, and may further specify that the one or more conductive features having the first thickness are traces to couple to a power plane or a ground plane.

Example 37 may include the subject matter of Example 34, and may further specify that the one or more conductive features having the second thickness are traces to transmit or to receive a signal.

Example 38 may include the subject matter of Example 34, and may further include: removing the first and second photoresist layers; forming a dielectric layer on the one or more conductive features having first and second thicknesses; laser drilling a via opening in the dielectric layer; and depositing conductive material in the via opening to form a conductive via.

Example 39 may include the subject matter of Example 34, and may further include: removing the first and second photoresist layers; depositing and patterning a third photoresist layer on the one or more conductive features having first and second thicknesses to form one or more via openings; depositing a third conductive layer in the one or more via openings to form one or more conductive vias; removing the third photoresist layer; and forming a dielectric layer on the one or more conductive features having first and second thicknesses and on the one or more conductive vias.

Example 40 may include the subject matter of Example 34, and may further include: depositing a seed layer on the substrate before depositing the first photoresist layer.

Example 42 may include the subject matter of Example 34, and may further specify that the first thickness is between 15 um and 45 um.

Example 43 may include the subject matter of Example 34, and may further specify that the second thickness is between 1 um and 25 um.

The invention claimed is:

1. A microelectronic assembly, comprising:
    a substrate;
    a first rectilinear conductive trace, having a first thickness and a first width, in the substrate; and
    a second rectilinear conductive trace, having a second thickness and a second width, in the substrate, wherein:
        the first and second rectilinear conductive traces each have straight top, bottom, and side surfaces, wherein the side surfaces are at a 90 degree angle to the top and bottom surfaces;
        the bottom surface of the second rectilinear conductive trace is coplanar with the bottom surface of the first rectilinear conductive trace;
        the first thickness is greater than the second thickness and the first width is greater than the second width;
        the first thickness is between 4 microns (um) and 70 um and the second thickness is between 1 um and 35 um;
        the first rectilinear conductive trace is electrically coupled to a power plane; and
        the second rectilinear conductive trace is electrically coupled to a data signal or a data transmission line.

2. The microelectronic assembly of claim 1, wherein the first width is between 5 um and 50 millimeters (mm) and the second width is between 1 um and 75 um.

3. The microelectronic assembly of claim 1, wherein the first and second rectilinear conductive traces have rectangular cross-sections.

4. The microelectronic assembly of claim 1, wherein the substrate is a package substrate.

5. A microelectronic assembly, comprising:
    a package substrate having a layer;
    a first conductive feature having a first thickness and a first width in the layer of the package substrate, wherein the first conductive feature is rectilinear; and a second conductive feature having a second thickness and a second width in the layer of the package substrate, wherein:
the first and second conductive features each have straight top, bottom, and side surfaces, wherein the side surfaces are at a 90 degree angle to the top and bottom surfaces;
the bottom surface of the second conductive feature is coplanar with the bottom surface of the first conductive feature;
the second conductive feature is rectilinear, wherein the first thickness is greater than the second thickness and the first width is greater than the second width, and wherein the first thickness is between 4 microns (um) and 70 um and the second thickness is between 1 um and 35 um;
the first conductive feature is electrically coupled to a power plane; and
the second conductive feature is electrically coupled to a data signal or a data transmission line.

6. The microelectronic assembly of claim 5, further comprising:
a die electrically coupled to the package substrate.

7. The microelectronic assembly of claim 5, wherein the first width is between 5 um and 50 millimeters (mm) and the second width is between 1 um and 75 um.

8. The microelectronic assembly of claim 6, wherein the die is a central processing unit, a radio frequency chip, a power converter, or a network processor.

9. The microelectronic assembly of claim 6, wherein the first conductive feature is electrically coupled to the die by conductive pathways in the package substrate.

10. The microelectronic assembly of claim 9, wherein the second conductive feature is electrically coupled to the die by conductive pathways in the package substrate.

11. A method of manufacturing a microelectronic assembly, comprising:
depositing and patterning a first photoresist layer on a substrate to form one or more openings;
forming a first conductive layer in the one or more openings to form a first conductive trace having a first thickness and a first width, wherein the first conductive trace is rectilinear having a straight top, bottom, and side surfaces, wherein the side surfaces are at a 90 degree angle to the top and bottom surfaces;
electrically coupling the first conductive trace to a power plane;
depositing and patterning a second photoresist layer on the first photoresist layer to cover one or more of the one or more openings;
forming a second conductive layer in the one or more openings not covered by the second photoresist layer to form a second conductive trace having a second thickness and a second width, wherein the second conductive trace is rectilinear having a straight top, bottom, and side surfaces, wherein the side surfaces are at a 90 degree angle to the top and bottom surfaces, wherein the first thickness is greater than the second thickness and the first width is greater than the second width, and wherein the first thickness is between 4 microns (um) and 70 um and the second thickness is between 1 um and 35 um; and
electrically coupling the second conductive trace to a data signal or a data transmission line.

12. The method of claim 11, wherein the first width is between 5 um and 50 millimeters (mm) and the second width is between 1 um and 75 um.

13. The method of claim 11, further comprising:
removing the first and second photoresist layers;
forming a dielectric layer on the first and second conductive traces;
laser drilling an opening in the dielectric layer; and
depositing conductive material in the opening to form a via, wherein the via is coupled to an individual first conductive trace.

14. A microelectronic assembly, comprising:
a substrate;
a first rectilinear conductive trace, having a first thickness and a first width, in the substrate; and
a second rectilinear conductive trace, having a second thickness and a second width, in the substrate, wherein:
the first and second rectilinear conductive traces each have straight top, bottom, and side surfaces, wherein the side surfaces are at a 90 degree angle to the top and bottom surfaces;
the bottom surface of the second rectilinear conductive trace is coplanar with the bottom surface of the first rectilinear conductive trace;
the first thickness is greater than the second thickness and the first width is greater than the second width;
wherein the first width is between 5 um and 50 millimeters (mm) and the second width is between 1 um and 75 um;
the first rectilinear conductive trace is electrically coupled to a power plane; and
the second rectilinear conductive trace is electrically coupled to a data signal or a data transmission line.

15. The microelectronic assembly of claim 14, wherein the first and second rectilinear conductive traces have rectangular cross-sections.

16. The microelectronic assembly of claim 14, wherein the substrate is a package substrate.

17. A microelectronic assembly, comprising:
a package substrate having a layer;
a first conductive feature having a first thickness and a first width in the layer of the package substrate, wherein the first conductive feature is rectilinear; and
a second conductive feature having a second thickness and a second width in the layer of the package substrate, wherein:
the first and second conductive features each have straight top, bottom, and side surfaces, wherein the side surfaces are at a 90 degree angle to the top and bottom surfaces;
the bottom surface of the second conductive feature is coplanar with the bottom surface of the first conductive feature;
the second conductive feature is rectilinear, wherein the first thickness is greater than the second thickness and the first width is greater than the second width, and wherein the first width is between 5 um and 50 millimeters (mm) and the second width is between 1 um and 75 um;
the first conductive feature is electrically coupled to a power plane; and
the second conductive feature is electrically coupled to a data signal or a data transmission line.

18. The microelectronic assembly of claim 17, further comprising:
a die electrically coupled to the package substrate.

19. The microelectronic assembly of claim 18, wherein the die is a central processing unit, a radio frequency chip, a power converter, or a network processor.

20. The microelectronic assembly of claim 18, wherein the first conductive feature and the second conductive feature are electrically coupled to the die by conductive pathways in the package substrate.

\* \* \* \* \*